United States Patent
Naylor et al.

(10) Patent No.: US 12,324,204 B2
(45) Date of Patent: Jun. 3, 2025

(54) TRANSISTORS INCLUDING TWO-DIMENSIONAL MATERIALS

(71) Applicant: INTEL CORPORATION, Santa Clara, CA (US)

(72) Inventors: Carl Hugo Naylor, Portland, OR (US); Kevin P. O'Brien, Portland, OR (US); Chelsey Jane Dorow, Portland, OR (US); Kirby Kurtis Maxey, Hillsboro, OR (US); Tanay Arun Gosavi, Hillsboro, OR (US); Ashish Verma Penumatcha, Beaverton, OR (US); Urusa Shahriar Alaan, Hillsboro, OR (US); Uygar E. Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 828 days.

(21) Appl. No.: 17/032,989

(22) Filed: Sep. 25, 2020

(65) Prior Publication Data

US 2022/0102499 A1    Mar. 31, 2022

(51) Int. Cl.
*H10D 62/17*   (2025.01)
*H10D 62/13*   (2025.01)
*H10D 62/80*   (2025.01)
*H10D 84/83*   (2025.01)

(52) U.S. Cl.
CPC ......... *H10D 62/235* (2025.01); *H10D 62/151* (2025.01); *H10D 62/80* (2025.01); *H10D 84/83* (2025.01)

(58) Field of Classification Search
CPC ............... H01L 29/1033; H01L 27/088; H01L 29/0847; H01L 29/24; H10D 62/235; H10D 62/151; H10D 30/47

USPC ......................................................... 257/43
See application file for complete search history.

(56) References Cited

U.S. PATENT DOCUMENTS

| | | | |
|---|---|---|---|
| 7,719,082 B2 | 5/2010 | Aratani et al. | |
| 9,899,501 B2 | 2/2018 | Pourtois et al. | |
| 10,818,803 B1* | 10/2020 | Frougier | H01L 29/1054 |
| 11,476,555 B1* | 10/2022 | Roper | G02F 1/19 |
| 2011/0147795 A1 | 6/2011 | Rachmady et al. | |
| 2012/0267595 A1 | 10/2012 | Fang et al. | |
| 2014/0021446 A1 | 1/2014 | Lee et al. | |

(Continued)

OTHER PUBLICATIONS

European Partial Search Report issued in EP Application No. 21192898 on Feb. 22, 2022; 12 pages.

Sun, H., et al., "A Low Contact Resistance Graphene Field Effect Transistor with Single-Layer-Channel and Multi-Layer-Contact," IEEE/ACM International Symposium on Nanoscale Architectures (Nanoarch); pp. 139-144 (Jul. 3, 2014).

(Continued)

*Primary Examiner* — Quoc D Hoang
(74) *Attorney, Agent, or Firm* — Akona IP PC

(57) ABSTRACT

Disclosed herein are transistors including two-dimensional materials, as well as related methods and devices. In some embodiments, a transistor may include a first two-dimensional channel material and a second two-dimensional source/drain (S/D) material in a source/drain (S/D), and the first two-dimensional material and the second two-dimensional material may have different compositions or thicknesses. In some embodiments, a transistor may include a first two-dimensional material in a channel and a second two-dimensional material in a source/drain (S/D), wherein the first two-dimensional material is a single-crystal material, and the second two-dimensional material is a single-crystal material.

20 Claims, 23 Drawing Sheets

(56) References Cited

U.S. PATENT DOCUMENTS

| | | | |
|---|---|---|---|
| 2014/0273340 A1 | 9/2014 | Van et al. | |
| 2016/0314968 A1 | 10/2016 | Kim et al. | |
| 2016/0359062 A1 | 12/2016 | Heo et al. | |
| 2016/0372365 A1 | 12/2016 | Tang et al. | |
| 2017/0012117 A1 | 1/2017 | Radosavljevic et al. | |
| 2018/0269059 A1* | 9/2018 | Lin | H01L 29/78681 |
| 2019/0043946 A1* | 2/2019 | Lee | H01L 29/0847 |
| 2019/0378715 A1 | 12/2019 | Lin et al. | |
| 2020/0098564 A1* | 3/2020 | Li | H01L 21/02433 |
| 2020/0373454 A1* | 11/2020 | Kallioinen | H01L 29/1606 |
| 2020/0388685 A1 | 12/2020 | Sharma et al. | |
| 2021/0202265 A1* | 7/2021 | Chuu | H01L 29/24 |
| 2021/0280470 A1* | 9/2021 | Cheng | H01L 21/30608 |
| 2022/0102495 A1* | 3/2022 | Maxey | H01L 29/7781 |
| 2022/0238692 A1 | 7/2022 | Nguyen et al. | |

OTHER PUBLICATIONS

"Transition Metal Dichalcogenide Monolayers," Wikipedia; 10 pages (Aug. 27, 2020).

Kang, K., et al., "High-Mobility Three-Atom-Thick Semiconducting Films with Wafer-Scale Homogeneity," Nature, vol. 620; pp. 656-660 (Apr. 30, 2015).

U.S. Appl. No. 16/902,069, filed Jun. 15, 2020 entitled "Charge-Transfer Spacers for Stacked Nanoribbon 2D Transistors," 40 pages.

U.S. Appl. No. 16/913,835, filed Jun. 26, 2020 entitled "TMD Inverted Nanowire Integration," 44 pages.

U.S. Appl. No. 16/914,137, filed Jun. 26, 2020 entitled "Transition Metal Dichalcogenide Nanowires and Methods of Fabrication," 60 pages.

U.S. Appl. No. 16/915,600, filed Jun. 29, 2020 entitled "Transition Metal Dichalcogenide (TMD) Layer Stack for Transistor Applications and Methods of Fabrication," 54 pages.

* cited by examiner

TRANSISTORS INCLUDING TWO-DIMENSIONAL MATERIALS

BACKGROUND

Capacitors are used in many different electronic device designs. These capacitors are typically separately fabricated and surface mounted to a substrate.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
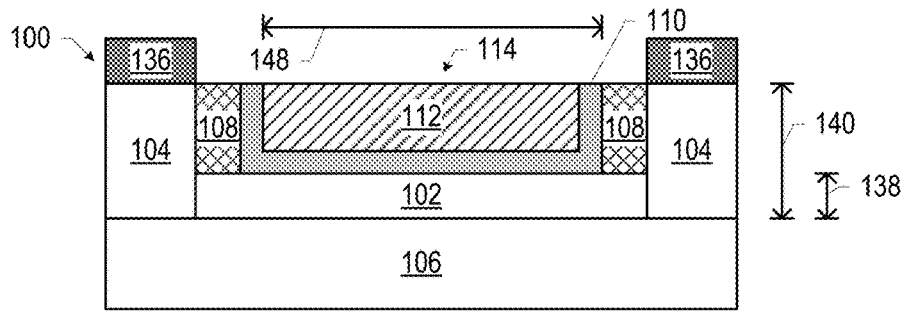
FIG. 1 is a side, cross-sectional view of a two-dimensional material (2DM) transistor, in accordance with various embodiments.

Disclosed herein are transistors including two-dimensional materials (2DMs), as well as related methods and devices. In some embodiments, a transistor may include a first 2D channel material and a second 2D source/drain (S/D) material, and the first 2D channel material and the second 2D S/D material may have different compositions or thicknesses. In some embodiments, a transistor may include a first 2DM in a channel and a second 2DM in a source/drain (S/D), wherein the first 2DM is a single-crystal material, and the second 2DM is a single-crystal material.

A number of barriers have conventionally limited or excluded the adoption of 2DMs in high-performance, high-volume computing. For example, 2DM transistors have typically exhibited high contact resistance (e.g., an order of magnitude greater than the contact resistances required for high-performance computing), and existing reactors, techniques, and integration flows have not been readily adaptable to achieve a 2DM transistor with satisfactory performance. Disclosed herein are a number of 2DM transistors that exhibit performance characteristics compatible with high-performance computing and that may be readily implemented using existing high-volume tools and processes. The 2DM transistors disclosed herein may allow for gate length scaling below 10 nanometers without significant short-channel effects (such as band-to-band tunneling or drain-induced barrier lowering), thus allowing transistor scaling to continue beyond conventional silicon limits.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrases "A and/or B" and "A or B" mean (A), (B), or (A and B). For the purposes of the present disclosure, the phrases "A, B, and/or C" and "A, B, or C" mean (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. For convenience, the phrase "FIG. 21" may be used to refer to the collection of drawings of FIGS. 21A-21C, "FIG. 22" may be used to refer to the collection of drawings of FIGS. 22A-22B, etc.

FIG. 1 is a side, cross-sectional view of a two-dimensional material (2DM) transistor 100, in accordance with various embodiments. The 2DM transistor 100 of FIG. 1 may include a 2DM channel 102 between two 2DM sources/drains (S/Ds). A gate 114 may include a gate dielectric 110 and a gate metal 112, and may be proximate to the 2DM channel 102 such that the gate dielectric 110 is between the gate metal 112 and the 2DM channel 102. In the embodiment of FIG. 100, a dielectric material 108 may be disposed between the gate 114 and the 2DM S/Ds 104. In some embodiments, the length 148 of the gate 114 may be less than 10 nanometers. The gate metal 112 and the gate dielectric 110 may take any of the forms discussed below with reference to the gate electrode and the gate dielectric, respectively, of FIG. 41. The dielectric material 108 may take any of the forms discussed below with reference to the sidewall spacers of FIG. 41.

The 2DM channel 102 and the 2DM S/Ds 104 may include one or more 2DMs. For example, the 2DM channel 102 and the 2DM S/Ds 104 may include one or more metal chalcogenides (MCs). An MC may include a transition metal or a post-transition metal, and the metal atom is not limited to 4+ oxidation states. In some embodiments, an MC may be a transition metal dichalcogenide (TMD). A TMD may include a transition metal, such as tungsten, molybdenum, niobium, tantalum, zirconium, hafnium, gallium, manganese, vanadium, or rhenium, and a chalcogen, such as sulfur, selenium, or tellurium. Some TMDs that may be included in a 2DM channel 102 and/or a 2DM S/D 104 may include niobium and sulfur (e.g., in the form of niobium disulfide), tungsten and selenium (e.g., in the form of tungsten diselenide), molybdenum and sulfur (e.g., in the form of molybdenum sulfide), and molybdenum and tellurium (e.g., in the form of molybdenum telluride), but these are simply examples, and any suitable TMD or other MC may be used. A 2DM included in a 2DM channel 102 and/or a 2DM S/D 104 may include other materials, such as indium and selenium (e.g., in the form of indium selenide). In some embodiments in which a 2DM transistor 100 is a n-type metal oxide semiconductor (NMOS) transistor, the 2DM channel 102 may include molybdenum and sulfur (e.g., in the form of molybdenum sulfide), molybdenum and tellurium (e.g., in the form of molybdenum telluride), or tungsten and sulfur (e.g., in the form of tungsten sulfide). In some embodiments in which a 2DM transistor 100 is a p-type metal oxide semiconductor (PMOS) transistor, the 2DM channel 102 may include tungsten and selenium (e.g., in the form of tungsten selenide) or tungsten and sulfur (e.g., in the form of tungsten sulfide).

In the particular embodiment of FIG. 1, the thickness 140 of the 2DM S/Ds 104 may be greater than the thickness 138 of the 2DM channel 102. For example, the thickness 138 of the 2DM channel 102 may be equal to the thickness of one or two layers of a 2DM therein, and the thickness 140 of the 2DM S/Ds 104 may be equal to the thickness of more than two layers of a 2DM therein (e.g., between 3 and 10 layers). In some embodiments, a 2DM channel 102 may be a monolayer 2DM; monolayer 2DMs may have bandgaps and effective masses larger than their multi-layer counterparts (and larger than silicon), which may aid in achieving a low "off" current for a 2DM transistor 100 at ultra-short lengths of the gate 114 (e.g., gate lengths of 10 nanometers or less). However, monolayer 2DMs may also exhibit high contact resistance. Utilizing 2DM S/Ds 104 that are thicker than the 2DM channel 102 (e.g., a 2DM S/D 104 that includes multiple 2DM layers) may reduce the contact resistance to an acceptable level.

Utilizing 2DM S/Ds 104 that have a different material composition than the 2DM channel 102 may also reduce the contact resistance of the 2DM transistor 100 to an acceptable level, instead of or in addition to different thicknesses. For example, a 2DM S/D 104 that includes one or more additives to move the Fermi level closer to the conduction or valence band to reduce the bandgap may result in a 2DM transistor 100 having an acceptable contact resistance. In some embodiments, a 2DM S/D 104 may include manganese or rhenium. In some embodiments, a 2DM transistor 100 may include an MC in the 2DM channel 102, and may include an MC with a different metal or a different chalcogen in the 2DM S/Ds 104. A 2DM S/D 104 may not have a uniform composition, but may have some variation in material composition over its volume (e.g., stepwise changes in material composition, as may be present in a 2DM transistor 100 like that of FIG. 9, or a gradient of material composition). In some embodiments, a 2DM S/D 104 may be thicker than a 2DM channel 102 and may have a different material composition than the 2DM channel 102, while in other embodiments, a 2DM S/D 104 may have a same thickness as the 2DM channel 102 (e.g., as discussed below with reference to FIGS. 21A, 21B, and 31) and may have a different material composition than the 2DM channel 102, or a 2DM S/D 104 may have a different thickness than the 2DM channel 102 and may have a same material composition as the 2DM channel 102.

A 2DM channel 102 and a 2DM S/D 104 may be formed using any suitable techniques, a number of which are discussed below. For example, a 2DM channel 102 and/or a 2DM S/D 104 may be grown by a seed-based technique in which an initial seed material is positioned in a desired location on the surface of the support 106, and a single-crystal 2DM, with no grain boundaries, is grown with the seed material as a template. In such embodiments, residue of the seed material (which may be different from the material grown on the seed) may remain in the 2DM transistor 100 (e.g., a residue of the seed material for the 2DM channel 102 may remain in the 2DM channel 102, etc.). Seed-based growth of the 2DM channel 102 and/or the 2DM S/Ds 104 is discussed in further detail below with reference to FIGS. 17-20. In another example, a 2DM channel 102 and/or a 2DM S/D 104 may be grown by metal organic chemical vapor deposition (MOCVD). When a 2DM is formed by MOCVD, the resulting material may not be single-crystal, but may have grains therein. In some embodiments, the grain sizes of a 2DM formed by MOCVD may be less than 5 microns (e.g., between 200 nanometers and 1 micron, between 200 nanometers and 5 microns, or between 1 micron and 5 microns). In other embodiments, other epitaxial techniques, such as molecular beam epitaxy (MBE) may be used.

The 2DM channel 102 and the 2DM S/Ds 104 may be disposed on a support 106. The support 106 may include any suitable material or combination of materials. For example, the support 106 may include a semiconductor material (e.g., when the 2DM transistor 100 is a front-end device, as discussed below with reference to FIG. 41) and a portion of a metallization stack (e.g., when the 2DM transistor 100 is a back-end device, as discussed below with reference to FIG. 41). In some embodiments, a material at the top surface of the support 106 may be closely lattice-matched to the 2DM of the 2DM channel 102 and/or lattice-matched to the 2DM of the 2DM S/Ds 104. For example, a material at the top surface of the support 106 may include aluminum and nitrogen (e.g., in the form of aluminum nitride) or gallium and nitrogen (e.g., in the form of gallium nitride); this material may be disposed on an underlying semiconductor (e.g., (111) silicon) in some embodiments. A conductive material 136 may be disposed on the 2DM S/Ds 104 to serve as S/D contacts; in the embodiment of FIG. 1, the conductive material 136 is illustrated as being non-coplanar with the gate 114, while in other embodiments, the conductive material 136 may be at least partially coplanar with the gate 114 and spaced away from the gate 114 by the dielectric material 108 (e.g., as discussed below with reference to FIG. 21). In some embodiments, the conductive material 136 may include gold, nickel, tungsten, molybdenum, titanium (e.g., as pure titanium and/or in the form of titanium nitride), and/or cobalt. In some embodiments, the conductive material 136 may include antimony, bismuth, and/or ruthenium (e.g., an alloy of any of these elements).

Figure 2:
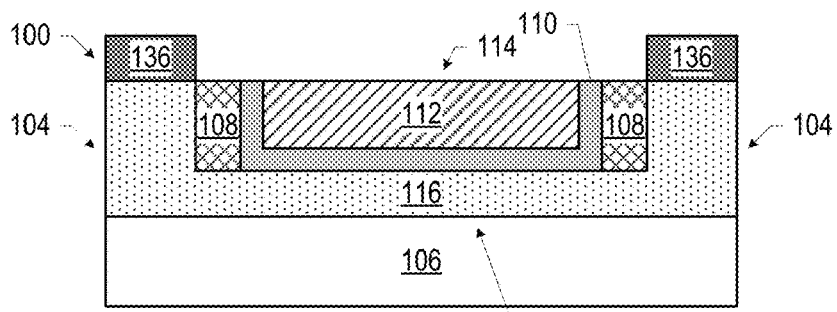
FIG. 2 is a side, cross-sectional view of an example embodiment of the 2DM transistor of FIG. 1.

FIG. 2 is a side, cross-sectional view of an example embodiment of the 2DM transistor 100 of FIG. 1. The embodiment of FIG. 2 (and others of the accompanying drawings) share a number of features with FIG. 1; for ease of description, these features will not be repeated and may take the form of any suitable embodiments of those features (e.g., any of the embodiments disclosed herein). In the particular embodiment of FIG. 2, the 2DM channel 102 and the 2DM S/Ds 104 may be provided by a continuous 2DM 116, with a thinner central portion providing the 2DM channel 102 and thicker lateral portions providing the 2DM S/Ds 104. As shown in FIG. 2, the 2DM 116 may have a recess, above the 2DM channel 102, in which the gate 114 is disposed.

The 2DM transistors 100 disclosed herein may be manufactured using any suitable techniques. For example, FIGS. 3-8 illustrate stages in an example process for manufacturing the 2DM transistor 100 of FIG. 2, in accordance with various embodiments. Operations are illustrated once each and in a particular order in the manufacturing process descriptions herein, but the operations may be reordered and/or repeated as desired (e.g., with different operations performed in parallel when manufacturing multiple 2DM transistors 100 simultaneously). The method of FIGS. 3-8 may be considered a "subtractive" method, as a 2DM 116 is grown and then partially removed, as discussed below.

Figure 3:
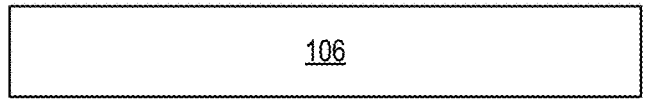
FIGS. 3-8 illustrate stages in an example process for manufacturing the 2DM transistor of FIG. 2, in accordance with various embodiments.

FIG. 3 is a side, cross-sectional view of an assembly including a support 106. The support 106 may take any of the forms disclosed herein, or any other suitable form.

Figure 4:
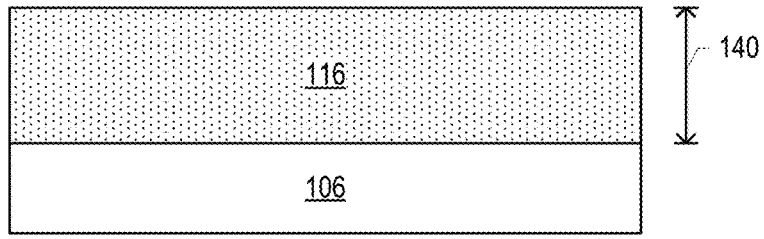

FIG. 4 is a side, cross-sectional view of an assembly subsequent to forming a 2DM 116 on the support 106 of FIG. 3. In some embodiments, the 2DM 116 may be formed by MOCVD. The 2DM 116 of FIG. 4 may have a substantially uniform thickness equal to the desired thickness 140 of the 2DM S/Ds 104 in the 2DM transistor 100, as shown, or greater than the desired thickness 140 (e.g., when some of the 2DM 116 is removed during a subsequent planarization operation, as discussed below with reference to FIG. 8).

Figure 5:
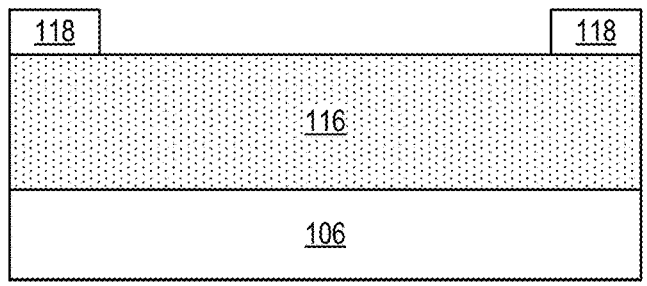

FIG. 5 is a side, cross-sectional view of an assembly subsequent to depositing and patterning a mask material 118 on the top surface of the 2DM 116 of FIG. 4. As shown in FIG. 5, the mask material 118 may be located on the portions of the 2DM 116 that correspond to the desired locations of the 2DM S/Ds 104. The mask material 118 may include any suitable material (e.g., a metal or dielectric material), and may be patterned using any suitable technique (e.g., a lithographic and etch technique). In some embodiments, the mask material 118 may be a metal, such as a gold, and may have a thickness between 3 and 10 nanometers.

Figure 6:
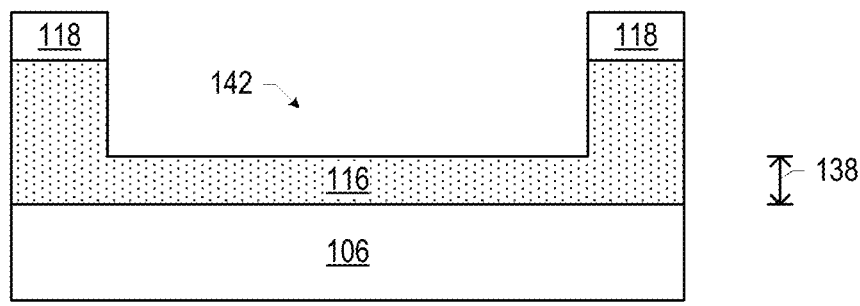

FIG. 6 is a side, cross-sectional view of an assembly subsequent to etching some of the 2DM 116 of the assembly of FIG. 5 in accordance with the mask material 118 to form a recess 142 in the 2DM 116. The 2DM 116 under the mask material 118 may be preserved, while some of the 2DM 116 unprotected by the mask material 118 may be etched away. The depth of the etch may be selected to achieve a desired thickness of the 2DM 116 under the recess 142 (corresponding to the desired thickness 138 of the 2DM channel 102 in the 2DM transistor 100, as shown). In some embodiments, an atomic layer etching (ALE) technique may be used to etch the 2DM 116 to a desired thickness (e.g., a desired number of layers in the 2DM channel 102).

Figure 7:
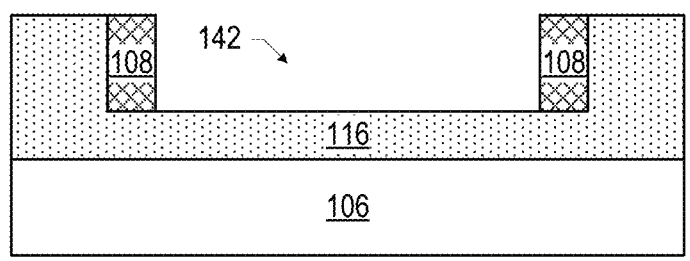

FIG. 7 is a side, cross-sectional view of an assembly subsequent to removing the mask material 118 from the assembly of FIG. 6 and forming spacers of dielectric material 108 on side faces of the recess 142. The dielectric material 108 may be formed using any suitable spacer deposition technique known in the art (e.g., a conformal deposition of the dielectric material 108 followed by a directional "downward" etch to remove the dielectric material 108 from horizontal surfaces while leaving at least some of it in place on vertical surfaces). In some embodiments, the mask material 118 may not be removed, but may remain in place as part of the 2DM transistor 100 (e.g., as part of an S/D contact, when the mask material 118 is conductive (e.g., a metal), or as part of the dielectric material above the 2DM transistor 100).

Figure 8:
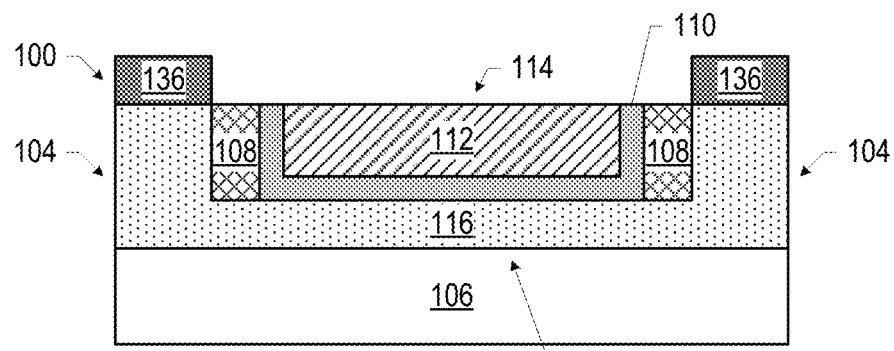

FIG. 8 is a side, cross-sectional view of an assembly subsequent to providing the gate dielectric 110 and the gate metal 112 in the recess 142 of the assembly of FIG. 7, thus forming the gate 114. The assembly of FIG. 8 may take the form of the 2DM transistor 100 of FIG. 2. In some embodiments, to fabricate the assembly of FIG. 8, the gate dielectric 110 may be conformally deposited on the assembly of FIG. 7, a blanket metal deposition operation may be performed to deposit the gate metal 112, and then a planarization operation (e.g., a chemical mechanical polishing (CMP) technique) may be performed to remove the gate dielectric 110 and gate metal 112 above the 2DM S/Ds 104 and the dielectric material 108.

Figure 9:
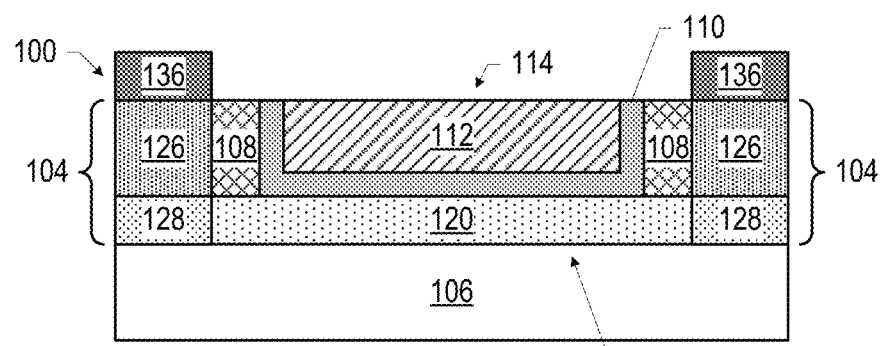
FIG. 9 is a side, cross-sectional view of another example embodiment of the 2DM transistor of FIG. 1.

FIG. 9 is a side, cross-sectional view of another example embodiment of the 2DM transistor 100 of FIG. 1. In the particular embodiment of FIG. 9, the 2DM channel 102 may include a 2DM 120 and the 2DM S/Ds 104 may include a 2DM 128 (coplanar with the 2DM 120 of the 2DM channel 102) and a 2DM 126 (above the 2DM 128 and coplanar with the gate 114). The 2DMs 120, 128, and 126 may take any of a number of forms. In some embodiments, the 2DM 128 may share various properties with the 2DM 120. For example, the 2DM 120 and the 2DM 128 may both be MCs, but may differ in their metal content and/or in their chalcogen content. In some embodiments, the 2DM 120 and the 2DM 128 may include a common MC, but the 2DM 120 and/or the 2DM 128 may include one or more additives (e.g., one or more dopant atoms). In some embodiments, the 2DM 120 may include molybdenum and sulfur (e.g., in the form of molybdenum sulfide), and the 2DM 128 and/or the 2DM 126 may include niobium, molybdenum, and sulfur (e.g., in the form of niobium-doped molybdenum sulfide). In some embodiments, the 2DM 120 may include molybdenum and sulfur (e.g., in the form of molybdenum sulfide), and the 2DM 128 and/or the 2DM 126 may include tellurium, molybdenum, and sulfur (e.g., in the form of a molybdenum-sulfur-tellurium alloy).

Figure 10:
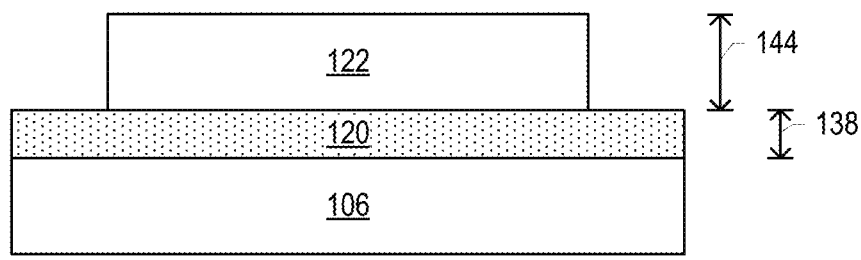
FIGS. 10-13 illustrate stages in an example process for manufacturing the 2DM transistor of FIG. 9, in accordance with various embodiments.

FIGS. 10-13 illustrate stages in an example process for manufacturing the 2DM transistor 100 of FIG. 9, in accordance with various embodiments. The method of FIGS. 10-13 may be considered an "additive" method. FIG. 10 is a side, cross-sectional view of an assembly subsequent to forming a 2DM 120 on the support 106 of FIG. 3, and then depositing and patterning a mask material 122 on the top surface of the 2DM 120. The 2DM 120 of FIG. 10 may have a substantially uniform thickness equal to the desired thickness 138 of the 2DM channel 102 in the 2DM transistor 100, as shown. The mask material 122 may be located on the portion of the 2DM 120 that correspond to the desired location of the 2DM channel 102. The mask material 122 may include any suitable material (e.g., a metal or dielectric material), and may be patterned using any suitable technique (e.g., a lithographic and etch technique). The mask material 122 of FIG. 10 may have a substantially uniform thickness 144 equal to the difference between the desired thickness 140 of the 2DM S/Ds 104 in the 2DM transistor 100 and the desired thickness 138 of the 2DM channel 102 in the 2DM transistor 100, as shown, or greater than this difference (e.g., when some of the 2DM 126, formed subsequently, is removed during a subsequent planarization operation, as discussed herein).

Figure 11:
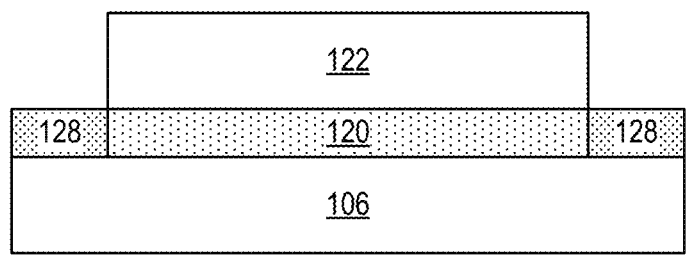

FIG. 11 is a side, cross-sectional view of an assembly subsequent to performing one or more treatment operations on the resulting assembly to change the properties of the portion of the 2DM 120 not protected by the mask material 122 (to form the 2DM 128). In some embodiments in which the 2DM 120 includes an MC, the treatment operation may include a metal substitution process in which the metal of the MC is replaced with a different metal (e.g., niobium, tantalum, vanadium, or rhenium) in the 2DM 128. In some embodiments in which the 2DM 120 includes an MC, the treatment operation may include a chalcogen substitution process in which the chalcogen of the MC is replaced with a different chalcogen or other element (e.g., phosphorous, arsenic, ruthenium, bismuth, or bromine) in the 2DM 128. In some embodiments, a treatment operation performed to generate the 2DM 128 may include a plasma or ozone treatment (e.g., to create vacancies).

Figure 12:
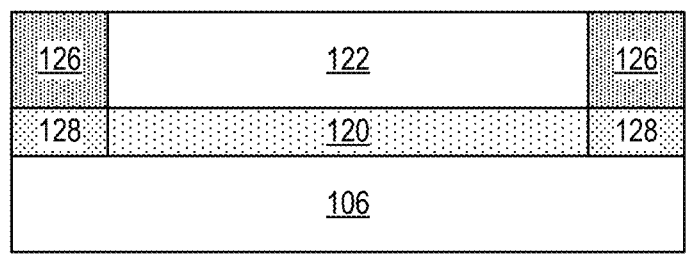

FIG. 12 is a side, cross-sectional view of an assembly subsequent to forming a 2DM 126 on the 2DM 128 of the assembly of FIG. 11. The 2DM 126 may be grown using a suitable epitaxial technique, for example. In some embodiments, the 2DM 126 may have a same material composition as the 2DM 128, or a different material composition. As noted above, in some embodiments, the 2DM 126 may have a non-uniform material composition (e.g., a gradient of various elements achieved by varying the epitaxial conditions under which the 2DM 126 is grown).

Figure 13:
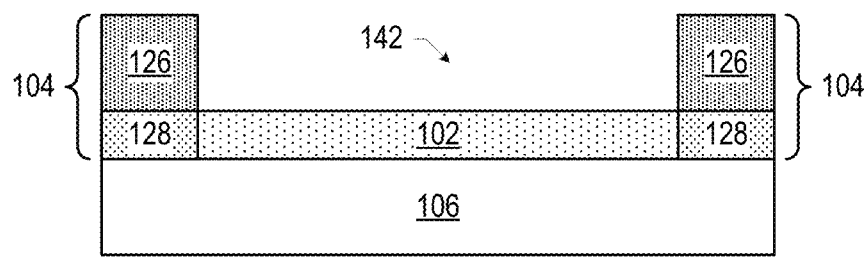

FIG. 13 is a side, cross-sectional view of an assembly subsequent to removing the mask material 122 from the assembly of FIG. 12, leaving a recess 142. Any suitable selective etch technique may be used to remove the mask material 122 without removing the 2DMs 120 and 126. The 2DM transistor 100 of FIG. 9 may then be completed by providing dielectric material 108 in the recess 142 of the assembly of FIG. 13, and then providing the gate dielectric 110 and the gate metal 112 in the recess 142, thus forming the gate 114. The formation of the dielectric material 108 and the gate 114 may take any suitable form (e.g., any of the forms discussed above with reference to FIGS. 7-8).

Figure 14:
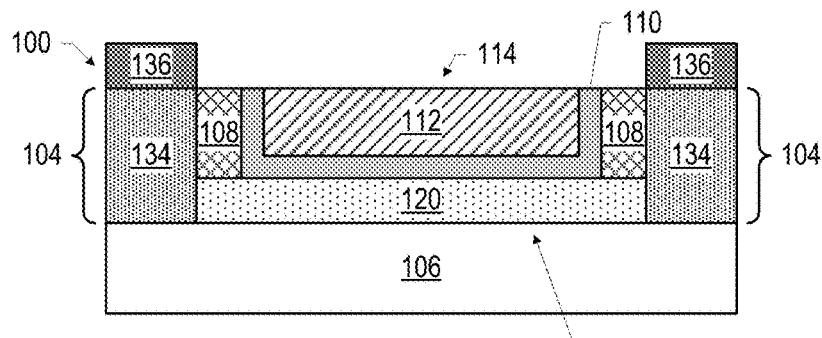
FIG. 14 is a side, cross-sectional view of another example embodiment of the 2DM transistor of FIG. 1.

FIG. 14 is a side, cross-sectional view of another example embodiment of the 2DM transistor 100 of FIG. 1. In the particular embodiment of FIG. 14, the 2DM channel 102 may include a 2DM 120 and the 2DM S/Ds 104 may include a 2DM 134 that is partially coplanar with the 2DM 120 of the 2DM channel 102 and partially coplanar with the gate 114. The 2DMs 120 and 134 may take any of a number of forms. In some embodiments, the 2DM 134 may share various properties with the 2DM 120. For example, the 2DM 120 and the 2DM 128 may both be MCs, but may differ in their metal content and/or in their chalcogen content. In some embodiments, the 2DM 120 and the 2DM 134 may include a common MC, but the 2DM 134 may include one or more additives (e.g., one or more dopant atoms).

Figure 15:
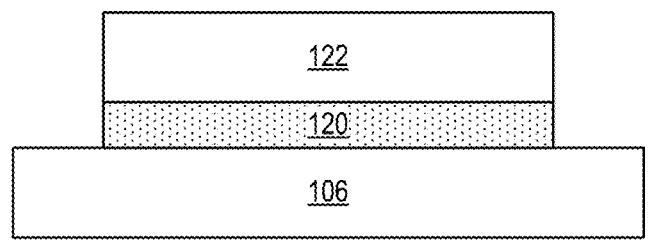
FIGS. 15-16 illustrate stages in an example process for manufacturing the 2DM transistor of FIG. 14, in accordance with various embodiments.
Figure 16:
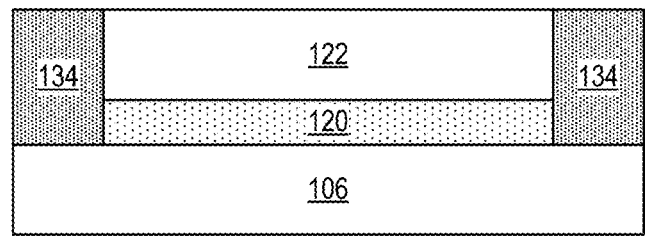

FIGS. 15-16 illustrate stages in an example process for manufacturing the 2DM transistor 100 of FIG. 14, in accordance with various embodiments. FIG. 15 is a side, cross-sectional view of an assembly subsequent to removing the portion of the 2DM 120 of the assembly of FIG. 10 that is not covered by the mask material 122. The removed portion of the 2DM 120 may correspond to the locations of the 2DM S/Ds 104. Any suitable selective etch technique may be used to form the assembly of FIG. 15 (e.g., a wet etch technique).

FIG. 16 is a side, cross-sectional view of an assembly subsequent to forming the 2DM 134 on the exposed portions of the support 106 of the assembly of FIG. 15. The 2DM 134 may be partially coplanar with the 2DM 120 and the mask material 122. The 2DM transistor 100 of FIG. 14 may be completed by removing the mask material 122 and providing the dielectric material 108 and the gate 114 in any suitable manner (e.g., as discussed above with reference to FIGS. 13-14).

Figure 17:
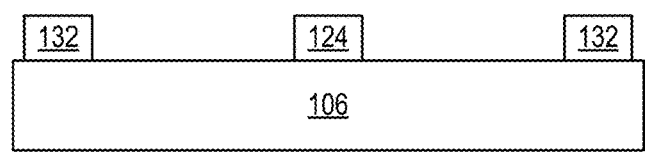
FIGS. 17-20 illustrate stages in another example process for manufacturing the 2DM transistor of FIG. 14, in accordance with various embodiments.

FIGS. 17-20 illustrate stages in another example process for manufacturing the 2DM transistor 100 of FIG. 14, in accordance with various embodiments. As noted above, the process of FIGS. 17-20 is a seed-based process, yielding a single-crystal 2DM channel 102 and single-crystal 2DM S/Ds 104. FIG. 17 is a side, cross-sectional view of an assembly subsequent to providing a seed material 124 on the support 106 of FIG. 3 at the desired location of the 2DM channel 102, and providing seed material 132 on the resulting assembly at the desired locations of the 2DM S/Ds 104. The location of the seed material 124 and 132 in the assembly of FIG. 17 may dictate the location of the 2DMs 120 and 134 grown thereon, respectively, and thus good positioning of these seed materials may correspond to good control of the locations of the 2DM channel 102 and the 2DM S/Ds 104 of a 2DM transistor 100. In some embodiments, the seed material 124 and 132 may include oxygen (e.g., as part of an oxide material). For example, the seed material 124 may include tungsten and oxygen (e.g., in the form of tungsten oxide for a 2DM channel 102 that includes tungsten), and the seed material 132 may include tantalum and oxygen (e.g., in the form of tantalum oxide for a 2DM S/D 104 that includes tantalum)

Figure 18:
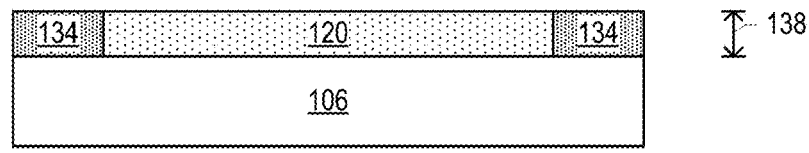

FIG. 18 is a side, cross-sectional view of an assembly subsequent to growing the seed material 124 of the assembly of FIG. 17 into the 2DM 120, and growing the seed material 132 of the assembly of FIG. 17 into an initial portion of the 2DM 134. This growth may be facilitated by providing a gas that includes the elements desired to be grown (e.g., a hydride gas including a chalcogen to facilitate the growth of that chalcogen). For example, providing a selenium hydride gas to a tungsten oxide seed material 124 may facilitate the growth of tungsten selenide as the 2DM 120, and providing the selenium hydride gas to a tantalum oxide seed material 132 may facilitate the growth of tantalum selenide as the initial portion of the 2DM 134. Variables such as seed thickness, temperature, the presence of growth promoters, pressure, and gas concentration may be adjusted to achieve desired growth characteristics. The 2DM 120 and initial portions of the 2DM 134 of FIG. 18 may have a substantially uniform thickness equal to the desired thickness 138 of the 2DM channel 102 in the 2DM transistor 100, as shown.

Figure 19:
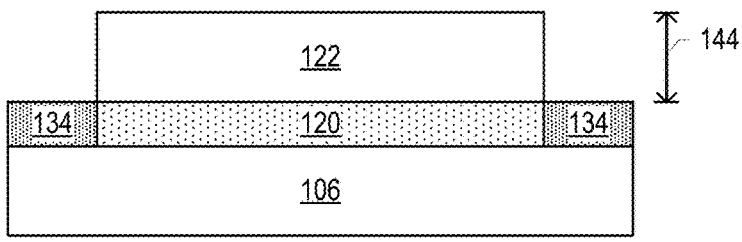

FIG. 19 is a side, cross-sectional view of an assembly subsequent to depositing and patterning a mask material 122 on the top surface of the 2DM 120. The mask material 122 may be located on the 2DM 120, but may leave the initial portion of the 2DM 134 exposed, and may include any suitable material (e.g., a metal or dielectric material), and may be patterned using any suitable technique (e.g., a lithographic and etch technique). The mask material 122 of FIG. 19 may have a substantially uniform thickness 144 equal to the difference between the desired thickness 140 of the 2DM S/Ds 104 in the 2DM transistor 100 and the desired thickness 138 of the 2DM channel 102 in the 2DM transistor 100, as shown, or greater than this difference (e.g., when some of the 2DM 126, formed subsequently, is removed during a subsequent planarization operation, as discussed herein).

Figure 20:
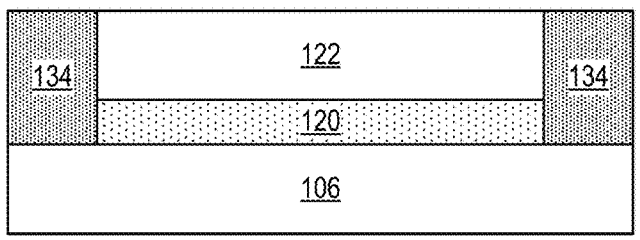

FIG. 20 is a side, cross-sectional view of an assembly subsequent to growing the rest of the 2DM 134 on the initial portion of the 2DM 134 of the assembly of FIG. 19. The 2DM 134 may be partially coplanar with the 2DM 120 and the mask material 122. The 2DM transistor 100 of FIG. 14 may be completed by removing the mask material 122 and providing the dielectric material 108 and the gate 114 in any suitable manner (e.g., as discussed above with reference to FIGS. 13-14).

Figure 21A:
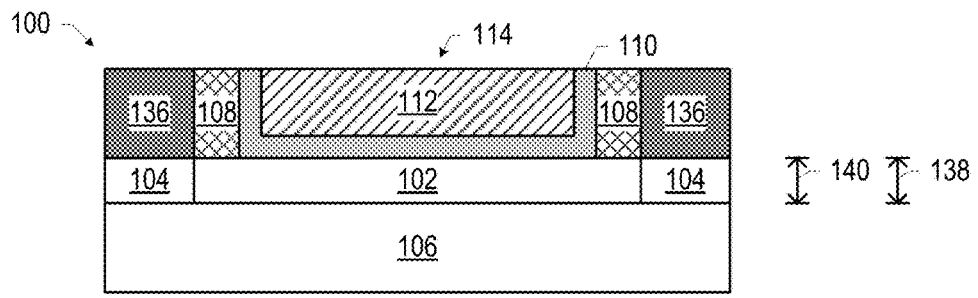
FIG. 21A-21C are side, cross-sectional views of other 2DM transistors, in accordance with various embodiments.

FIG. 21A is a side, cross-sectional view of another 2DM transistor 100. In the particular embodiment of FIG. 21A, the thickness 138 of the 2DM channel 102 is the same as the thickness 140 of the 2DM S/Ds 104, and the 2DM channel 102 is coplanar with the 2DM S/Ds 104. As noted above, in some such embodiments, the material composition of the 2DM channel 102 may be different from the material composition of the 2DM S/Ds 104 (e.g., to achieve a lower contact resistance for the 2DM transistor 100). A conductive material 136 may be disposed on the 2DM S/Ds 104, at least partially coplanar with the gate 114 and spaced away from the gate 114 by the dielectric material 108, and may serve as S/D contacts; the conductive material 136 may take any of the forms disclosed herein. The 2DM channel 102 and the 2DM S/Ds 104 may take the form of any of the embodiments of these elements disclosed herein (e.g., the 2DM S/Ds 104 may include the 2DM 128 or the 2DM 134), and a 2DM transistor 100 like that of FIG. 21A may be manufactured using any suitable technique (e.g., in accordance with the process discussed above with reference to FIGS. 10-13 but forming the conductive material 136 in place of the 2DM 126, or in accordance with the processes discussed above with reference to FIGS. 15-16 or 17-20 with analogous modifications).

Figure 21B:
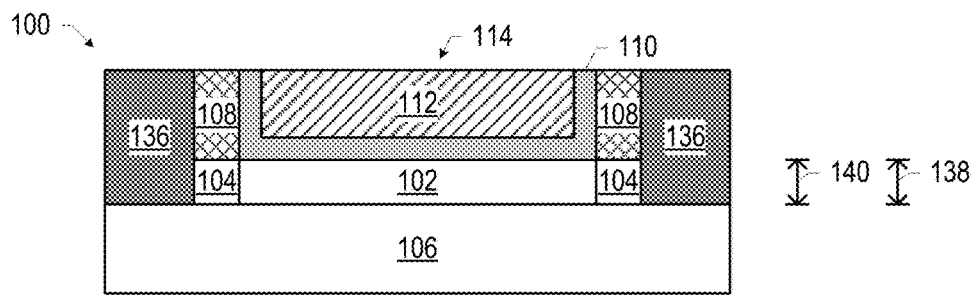

FIG. 21B is a side, cross-sectional view of another 2DM transistor 100. The particular embodiment of FIG. 21B is similar to the embodiment of FIG. 21A (e.g., the thickness 138 of the 2DM channel 102 is the same as the thickness 140 of the 2DM S/Ds 104), but different from the embodiment of FIG. 21A in that the 2DM S/Ds 104 are laterally coextensive with the spacers 108, and the conductive material 136 is partially coplanar with the gate 114 and partially coplanar with the 2DM S/Ds 104 and the 2DM channel 102. A 2DM transistor 100 like that of FIG. 21B may be manufactured using any suitable technique (e.g., in accordance with the process discussed above with reference to FIGS. 17-20 with appropriate modifications, such as widening the mask material 122 to cover the 2DM S/Ds 104 and then forming the conductive material 136).

Figure 21C:
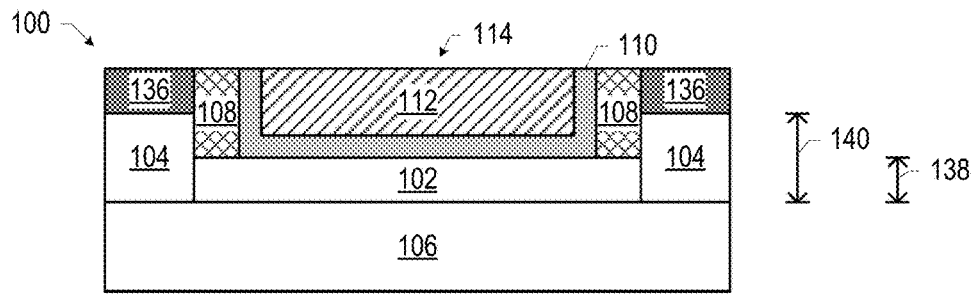

As noted above, in some embodiments of the 2DM transistors 100 disclosed herein, the thickness 138 of the 2DM channel 102 may be less than the thickness 140 of the 2DM S/Ds 104. However, the 2DM S/Ds 104 need not have a top surface that is coplanar with a top surface of a gate 114; FIG. 21C illustrates an embodiment similar to that of FIG. 1, but in which the top surface of the 2DM S/Ds 104 is not coplanar with a top surface of the gate 114. The elements of the 2DM transistor 100 of FIG. 21C may take any of the forms disclosed herein, and may be manufactured using any suitable technique (e.g., any suitable ones of the techniques disclosed herein, with appropriate modifications).

Figure 22A:
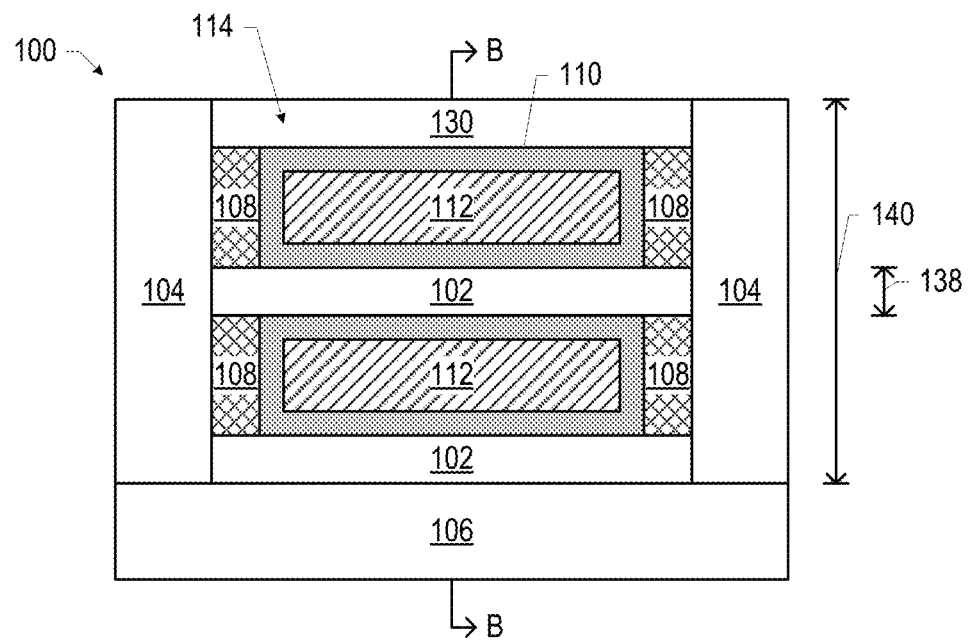
FIGS. 22A-22B are side, cross-sectional views of another 2DM transistor, in accordance with various embodiments.
Figure 22B:
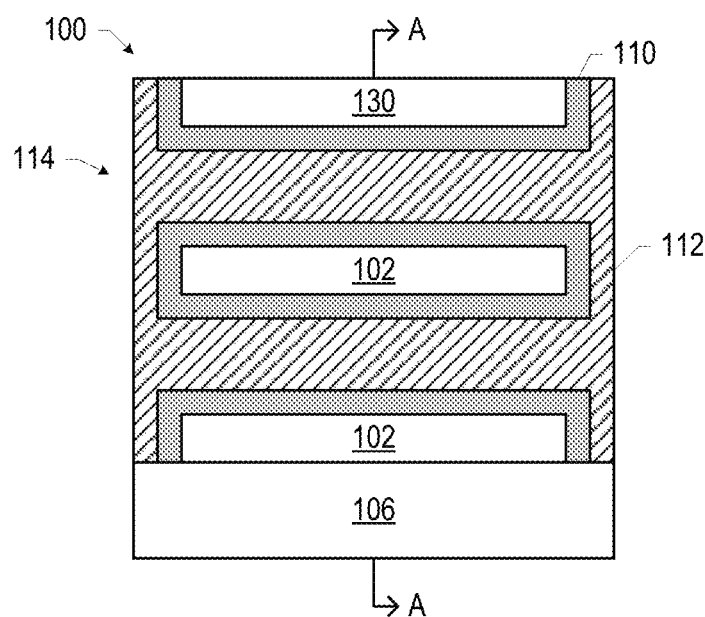

A 2DM transistor 100 may include a single 2DM channel 102 (e.g., as illustrated with respect to the 2DM transistors 100 of FIGS. 1, 2, 9, 14, and 21), or may include multiple 2DM channels 102. FIG. 22 illustrates a 2DM transistor 100 including multiple 2DM channels 102. In particular, FIG. 22A is a side, cross-sectional view through the section A-A of FIG. 22B, and FIG. 22B is a side, cross-sectional view through the section B-B of FIG. 22A. In the embodiment of FIG. 22, multiple 2DM channels 102 are arranged as parallel "ribbons" in a vertically oriented stack, as shown. A gate 114 may include a gate dielectric 110 and a gate metal 112, as discussed above with reference to FIG. 1; in some embodiments, a single gate 114 may extend across multiple "stacks" of 2DM channels 102 (not shown). A mask material 130 may be disposed above the stack of 2DM channels 102 and may serve as a "cap" on the gate 114. 2DM S/Ds 104 may be disposed at opposite ends of the 2DM channels 102. Although particular ones of the multi-channel 2DM transistors 100 disclosed herein are depicted as having a particular number of 2DM channels 102 (e.g., 2), this is simply illustrative, and a multi-channel 2DM transistor 100 may include any desired number of 2DM channels 102 (e.g., greater than 2).

Figure 23A:
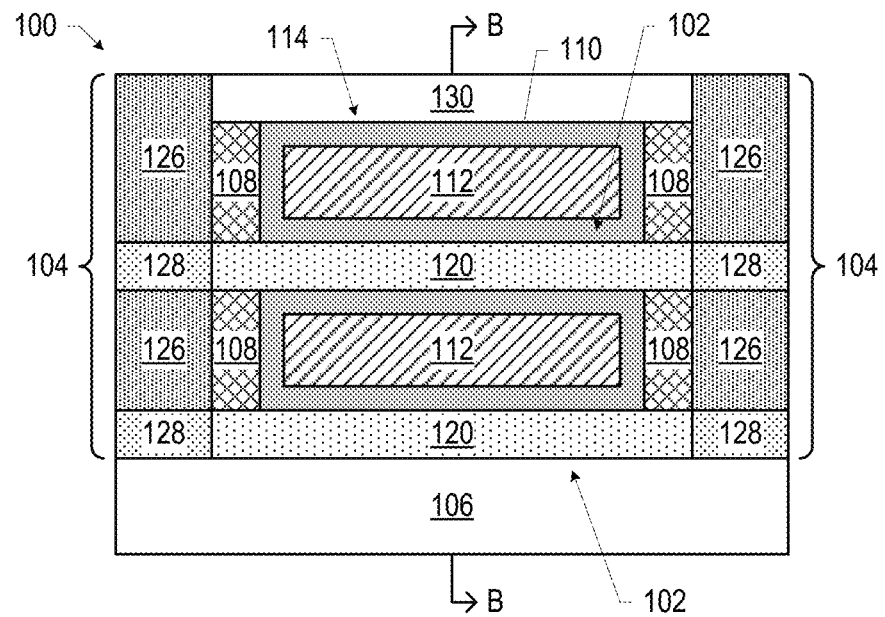
FIGS. 23A-23B are side, cross-sectional views of an example embodiment of the 2DM transistor of FIG. 22.
Figure 23B:
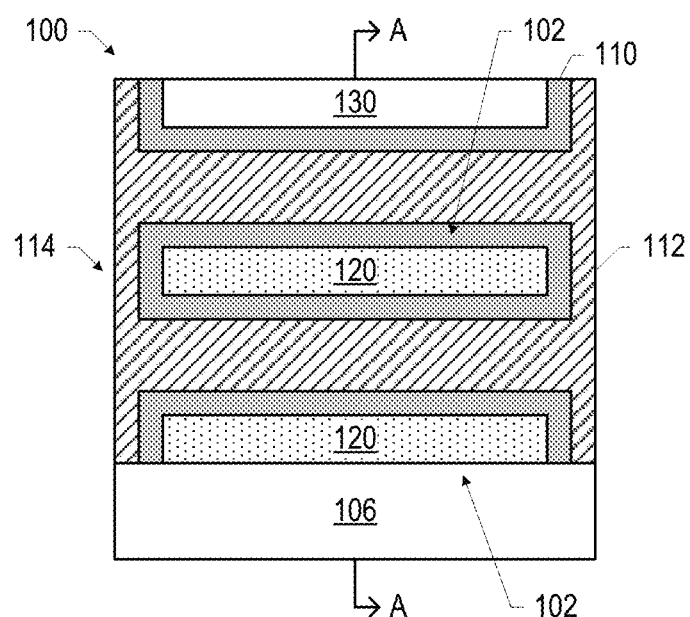

The 2DM channels 102 and 2DM S/Ds 104 of a multi-channel 2DM transistor 100, like that of FIG. 22, may take any of the forms disclosed herein. For example, FIG. 23 illustrates an example of the 2DM transistor 100 of FIG. 22 in which the 2DM channels 102 and 2DM S/Ds 104 are similar to those illustrated in FIG. 9. The "A" and "B" subfigures of FIGS. 23-33 share the perspectives of the "A" and "B" subfigures, respectively, of FIG. 22. In the particular embodiment of FIG. 23, the 2DM channel 102 may include a 2DM 120 and the 2DM S/Ds 104 may include a 2DM 128 (coplanar with the 2DM 120 of the 2DM channel 102) and a 2DM 126 (above and below the 2DM 128 and coplanar with the gate 114). The 2DMs 120, 128, and 126 of the 2DM transistor 100 of FIG. 23 may take any of the forms disclosed herein.

Figure 24A:
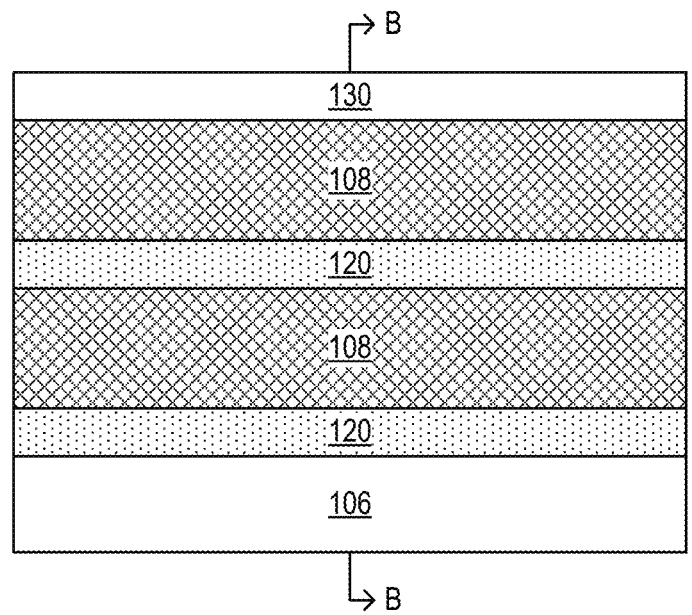
FIGS. 24A-24B, 25A-25B, 26A-26B, 27A-27B, 28A-28B, and 29A-29B illustrate stages in an example process for manufacturing the 2DM transistor of FIG. 23, in accordance with various embodiments.
Figure 24B:
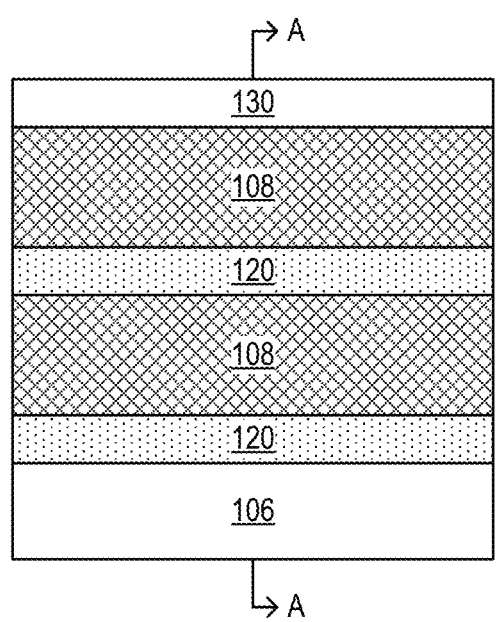

FIGS. 24-29 illustrate stages in an example process for manufacturing the 2DM transistor of FIG. 23, in accordance with various embodiments. FIG. 24 illustrates an assembly including a material stack on a support 106. The material stack may include layers of the 2DM 120 alternating with layers of the dielectric material 108. A layer of the mask material 130 may be at the top of the material stack. The assembly of FIG. 24 may be manufactured using any suitable techniques (e.g., epitaxial techniques).

Figure 25A:
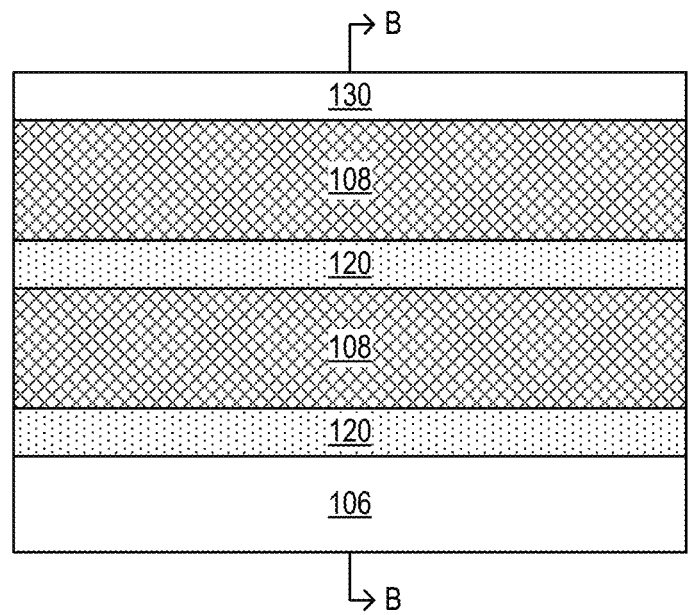
Figure 25B:
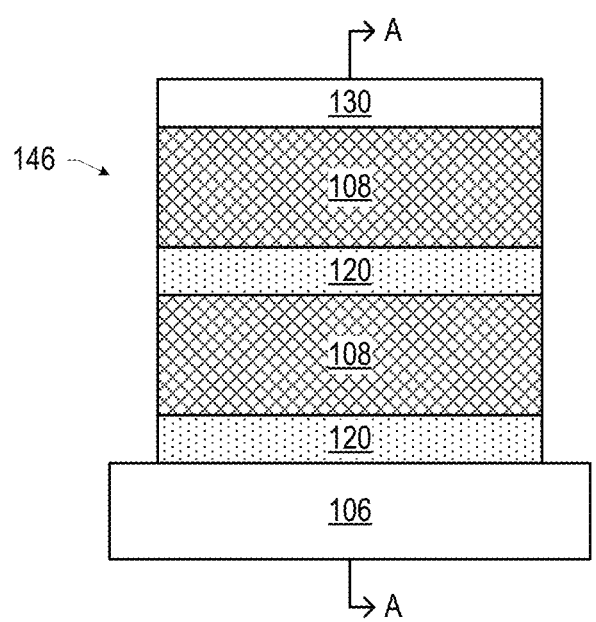

FIG. 25 illustrates an assembly subsequent to etching the material stack of the assembly of FIG. 24 to form a projection 146 on the support 106. Any suitable patterning techniques may be used. The section A-A (represented by the "A" subfigure) may be along the longitudinal axis of the projection 146, and the section B-B (represented by the "B" subfigure) may be perpendicular to the longitudinal axis of the projection 146.

Figure 26A:
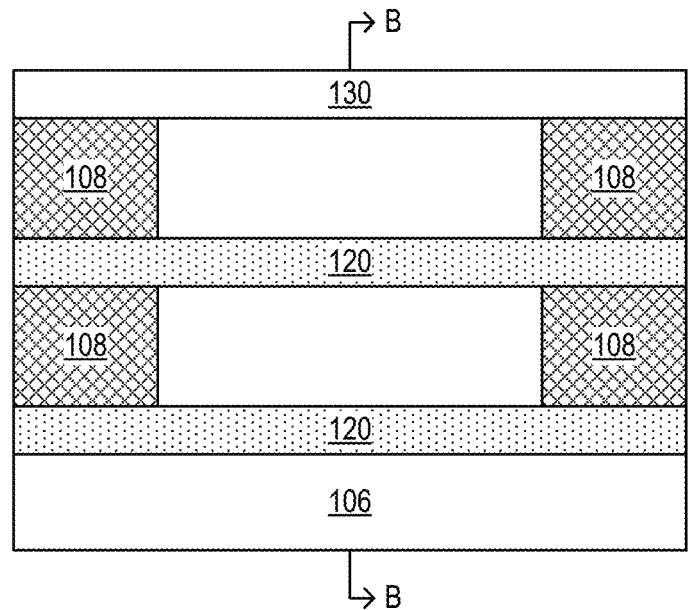
Figure 26B:
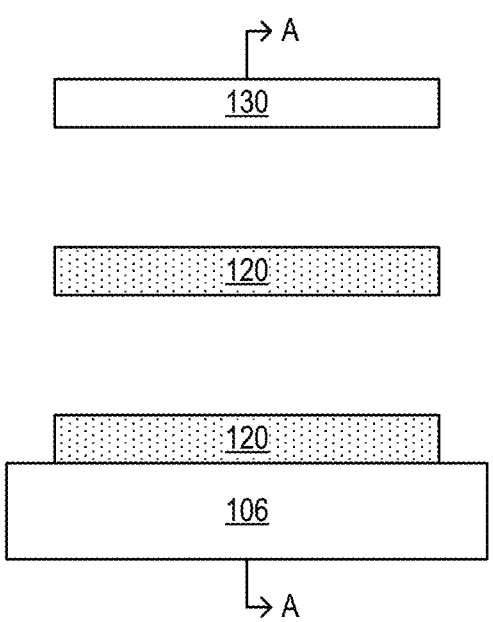

FIG. 26 illustrates an assembly subsequent to removing some of the dielectric material 108 from the assembly of FIG. 25. This removal may be accomplished etching the dielectric material 108 from the exposed side faces of the projection 146 (e.g., using a timed or directional etch).

Figure 27A:
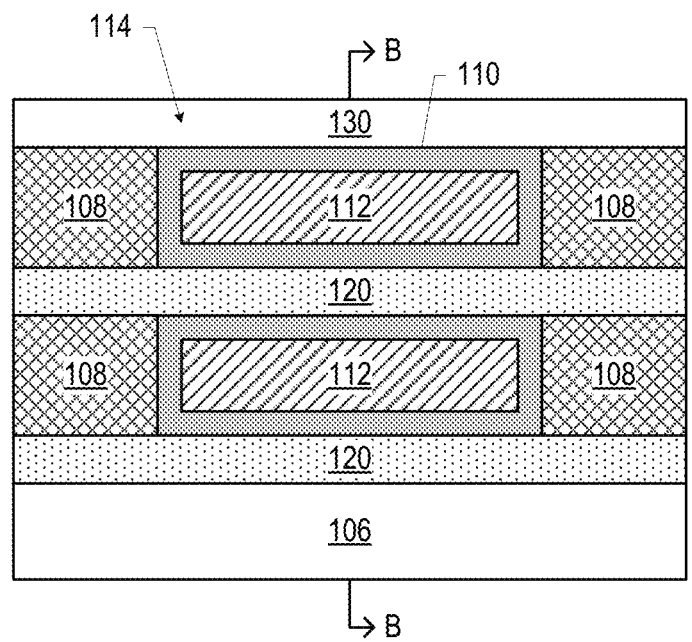
Figure 27B:
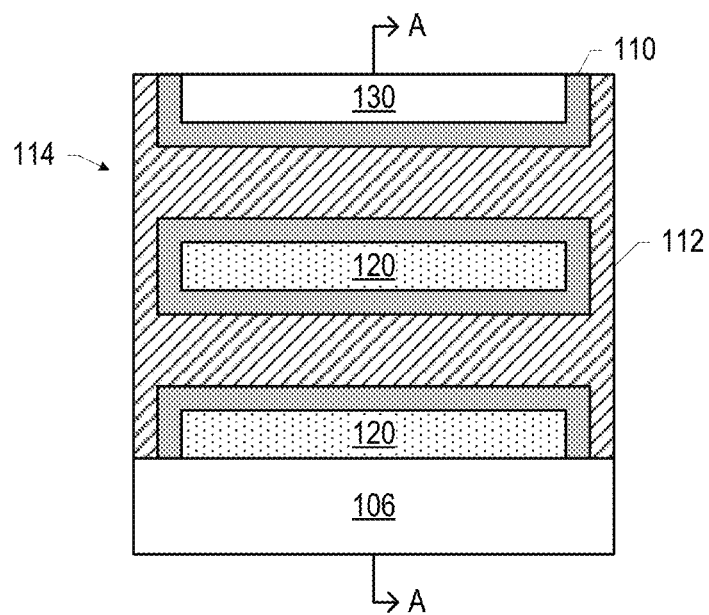

FIG. 27 illustrates an assembly subsequent to forming the gate 114 by conformally depositing the gate dielectric on the assembly of FIG. 26 and subsequently depositing the gate metal 112.

Figure 28A:
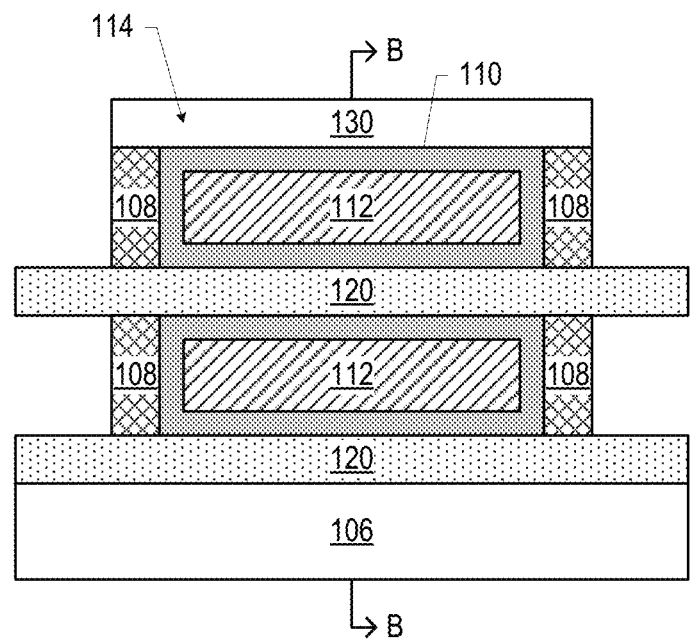
Figure 28B:
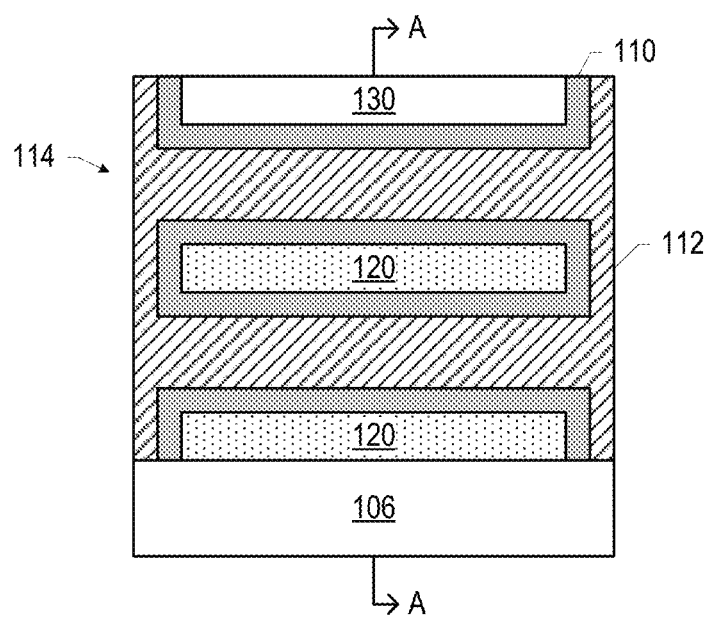

FIG. 28 illustrates an assembly subsequent to patterning the mask material 130 of the assembly of FIG. 27 so as to remove the mask material 130 above the desired locations of the 2DM S/Ds 104, and then removing the dielectric material 108 not protected by the remaining mask material 130. Any suitable etch techniques may be used.

Figure 29A:
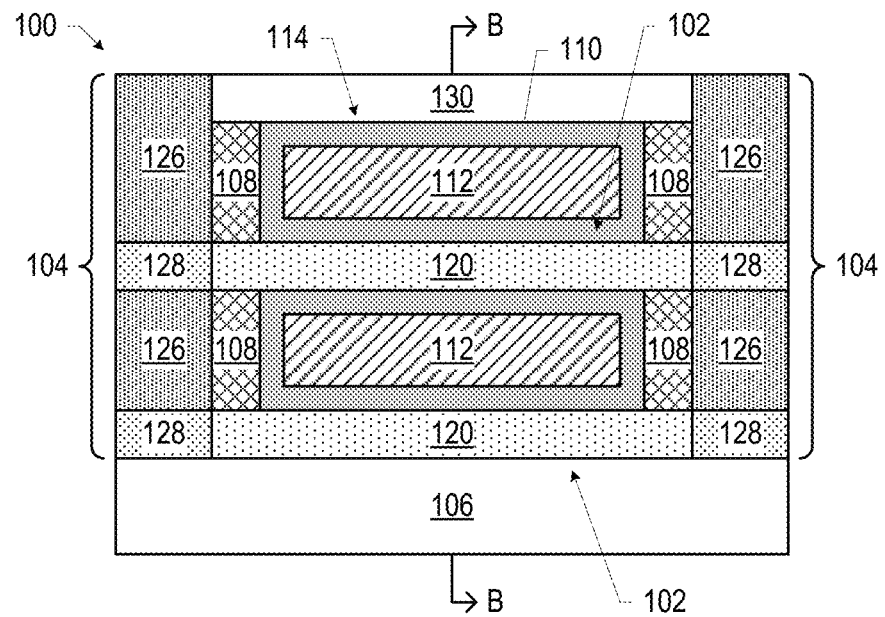
Figure 29B:
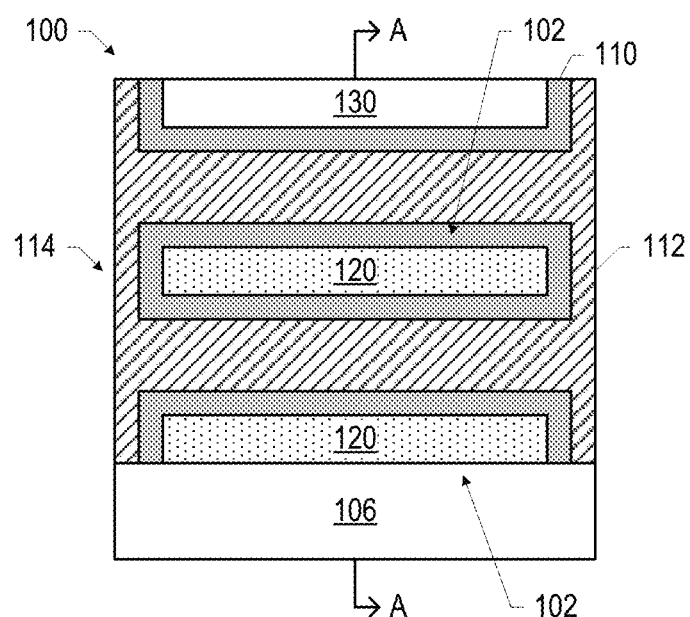

FIG. 29 illustrates an assembly subsequent to performing one or more treatment operations on the assembly of FIG. 28 to change the properties of the exposed portions of the 2DM 120 to form the 2DM 128, and then forming a 2DM 126 on the 2DM 128 of the resulting assembly. These operations may be performed in accordance with any suitable technique (e.g., as discussed above with reference to FIGS. 10-11). The assembly of FIG. 29 may take the form of the 2DM transistor 100 of FIG. 23.

Figure 30A:
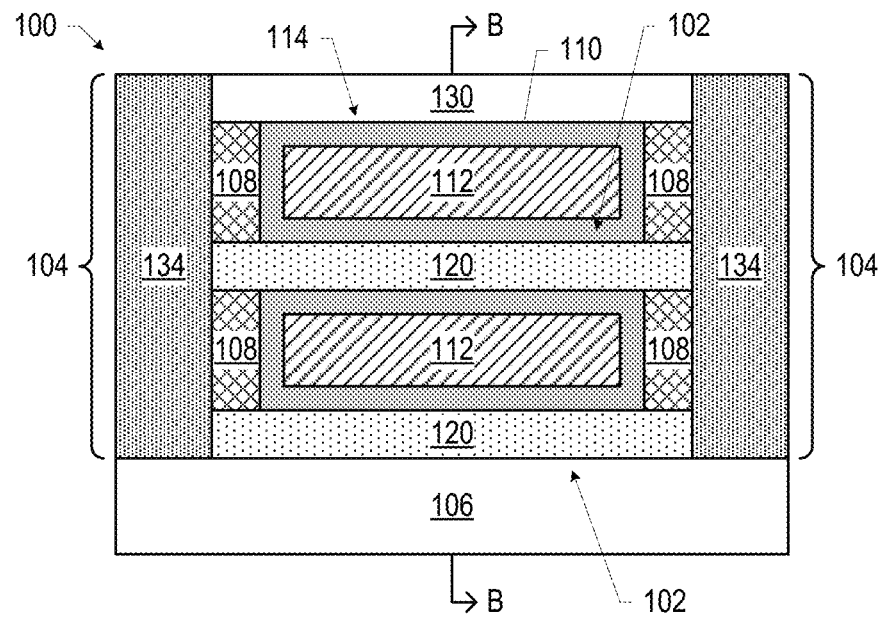
FIGS. 30A-30B are side, cross-sectional views of another example embodiment of the 2DM transistor of FIG. 22.
Figure 30B:
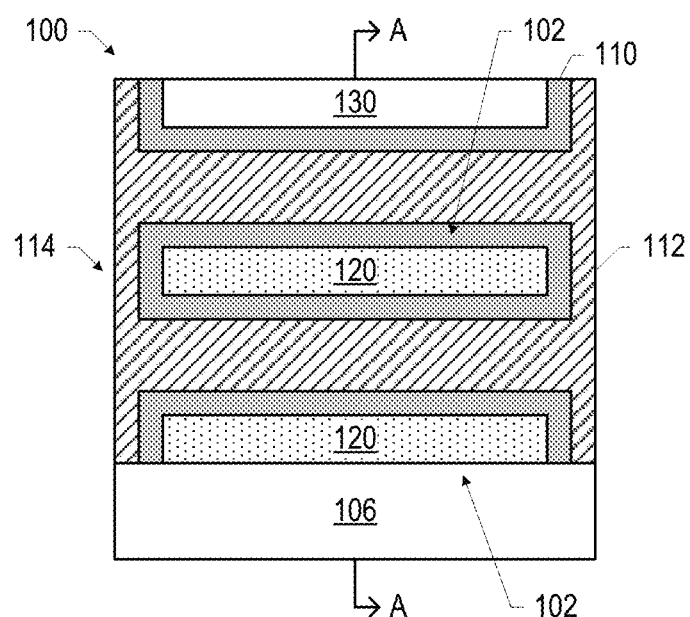

FIG. 30 illustrates an example of the 2DM transistor 100 of FIG. 22 in which the 2DM channels 102 and 2DM S/Ds 104 are similar to those illustrated in FIG. 14. In the particular embodiment of FIG. 30, the 2DM channels 102 may include a 2DM 120 and the 2DM S/Ds 104 may include a 2DM 134 that is partially coplanar with the 2DM 120 of the 2DM channel 102 and partially coplanar with the gate 114. The 2DMs 120 and 134 may take any of the forms disclosed herein, and may be manufactured by using the techniques of FIGS. 24-29 in combination with the techniques of FIGS. 15-16 or in combination with the techniques of FIGS. 17-20.

Figure 31A:
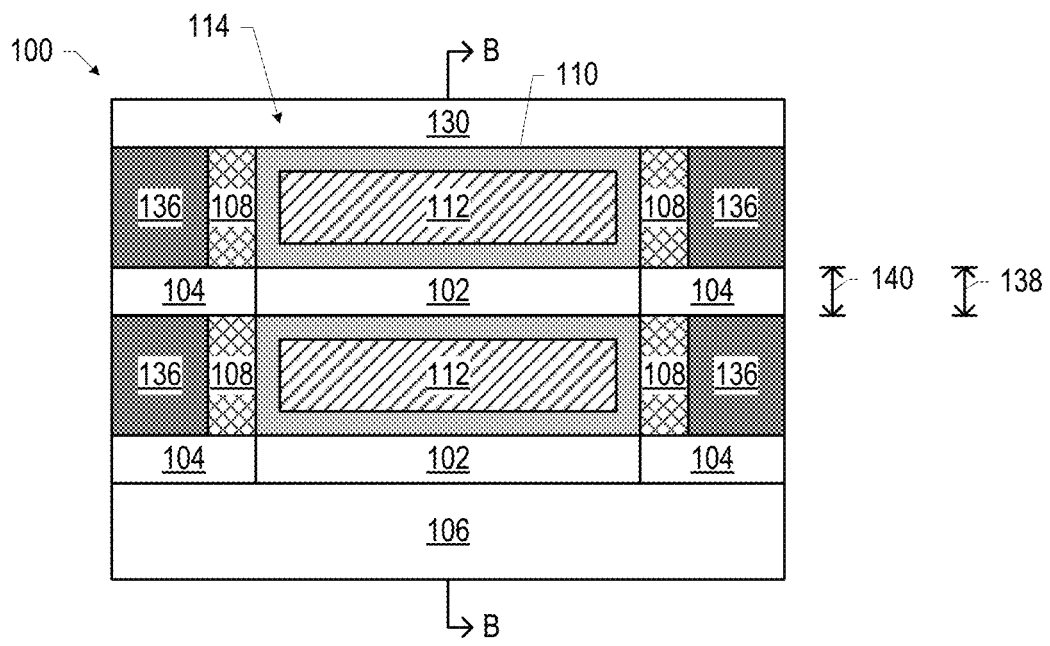
FIGS. 31A-31B are side, cross-sectional views of another 2DM transistor, in accordance with various embodiments.
Figure 31B:
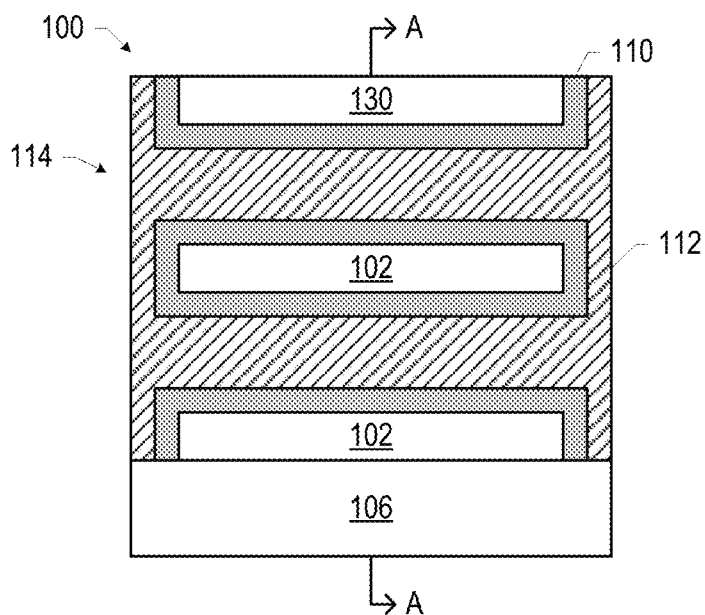

FIG. 31 illustrates another 2DM transistor 100. In the particular embodiment of FIG. 31, the thickness 138 of the 2DM channel 102 is the same as the thickness 140 of the 2DM S/Ds 104, and the 2DM channel 102 is coplanar with the 2DM S/Ds 104. A conductive material 136 may be disposed on the 2DM S/Ds 104, at least partially coplanar with the gate 114 and spaced away from the gate 114 by the dielectric material 108, and may serve as S/D contacts; the conductive material 136 may take any of the forms disclosed herein. The 2DM channel 102 and the 2DM S/Ds 104 may take the form of any of the embodiments of these elements disclosed herein.

Figure 32A:
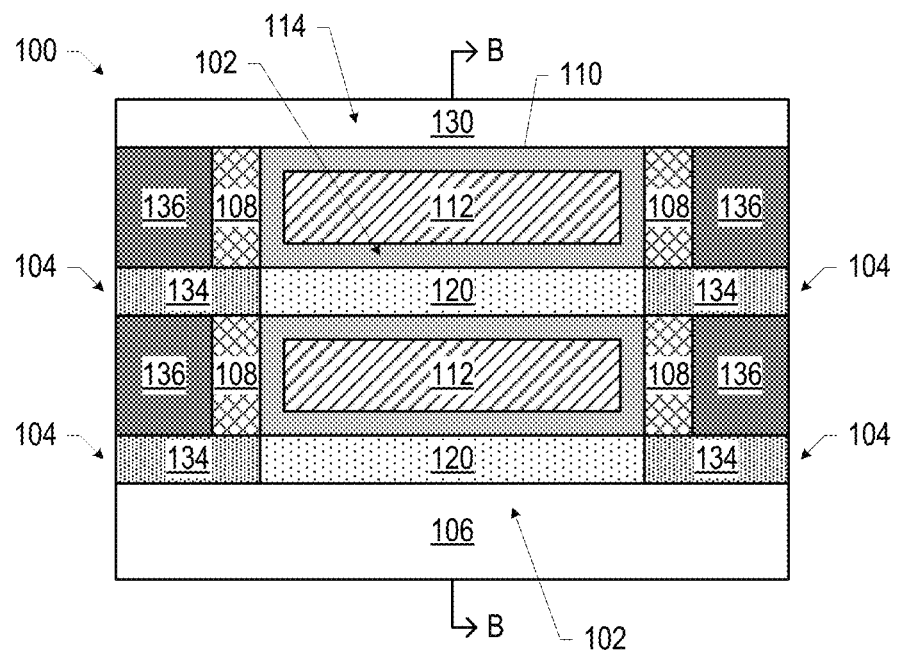
FIGS. 32A-32B are side, cross-sectional views of an example embodiment of the 2DM transistor of FIG. 31.
Figure 32B:
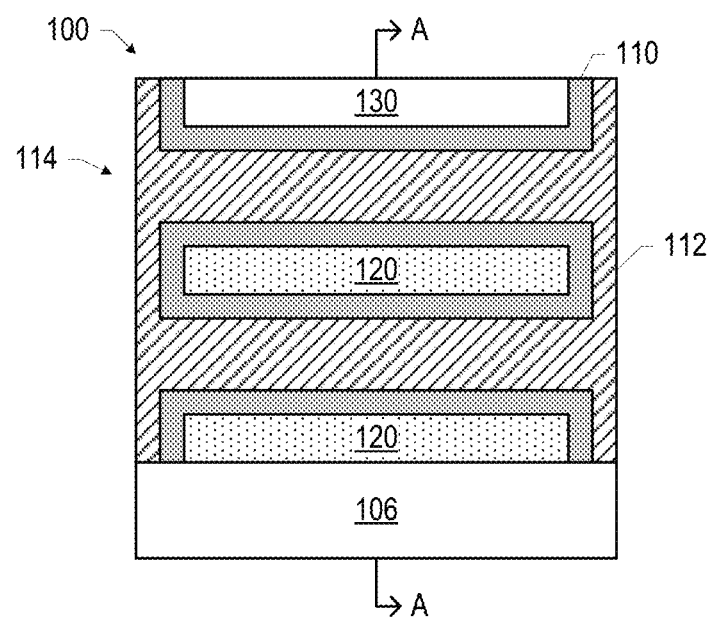

FIG. 32 illustrates an example of the 2DM transistor 100 of FIG. 31 in which the 2DM channels 102 and 2DM S/Ds 104 are similar to those illustrated in FIG. 14. In the particular embodiment of FIG. 32, the 2DM channels 102 may include a 2DM 120 and the 2DM S/Ds 104 may include a 2DM 134 that is coplanar with the 2DM 120 of the associated 2DM channel 102. The 2DMs 120 and 134 of the 2DM transistor 100 of FIG. 32 may take any of the forms disclosed herein.

Figure 33A:
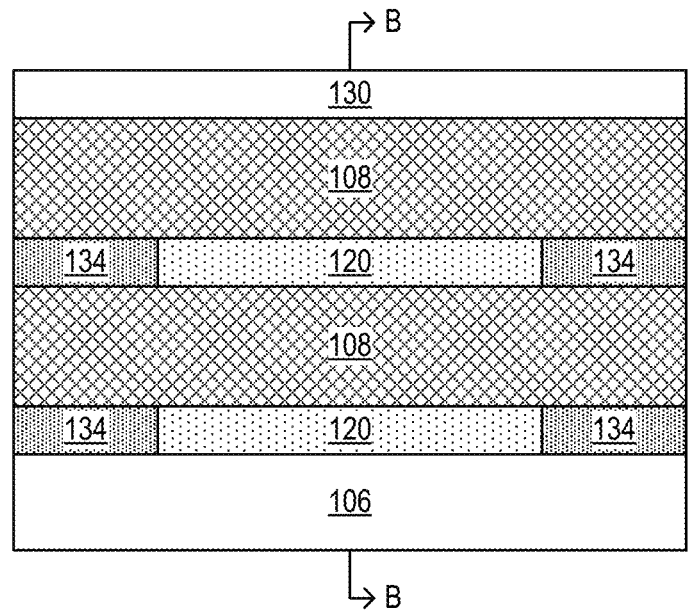
FIGS. 33A-33B, 34A-34B, and 35A-35B illustrate stages in an example process for manufacturing the 2DM transistor of FIG. 32, in accordance with various embodiments.
Figure 33B:
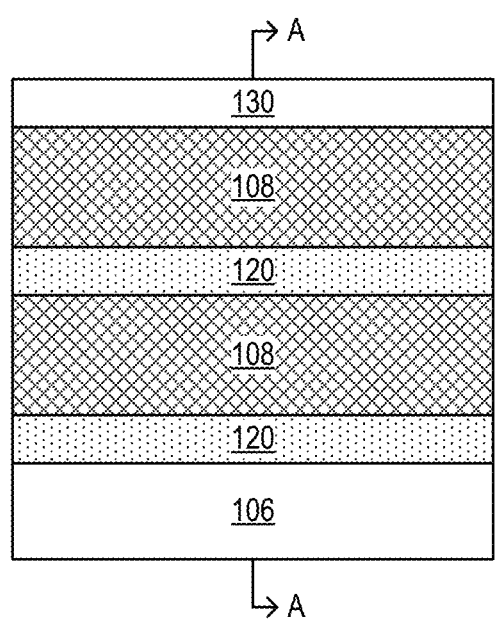
Figure 34A:
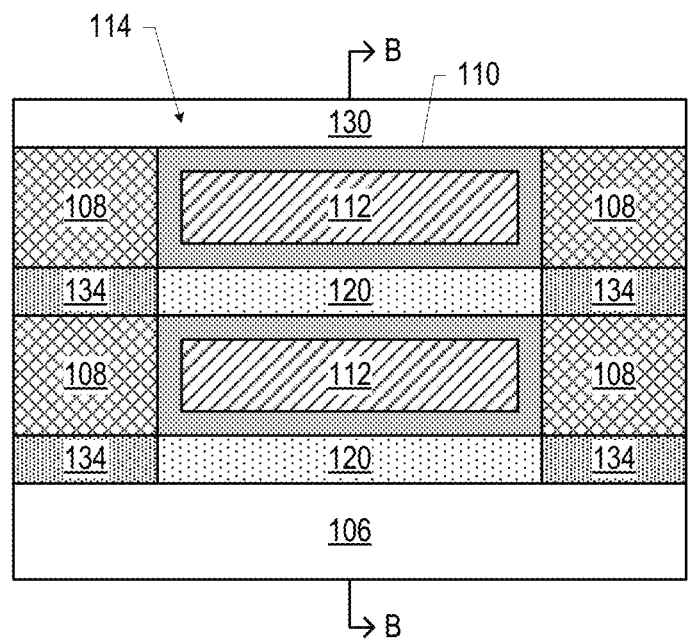
Figure 34B:
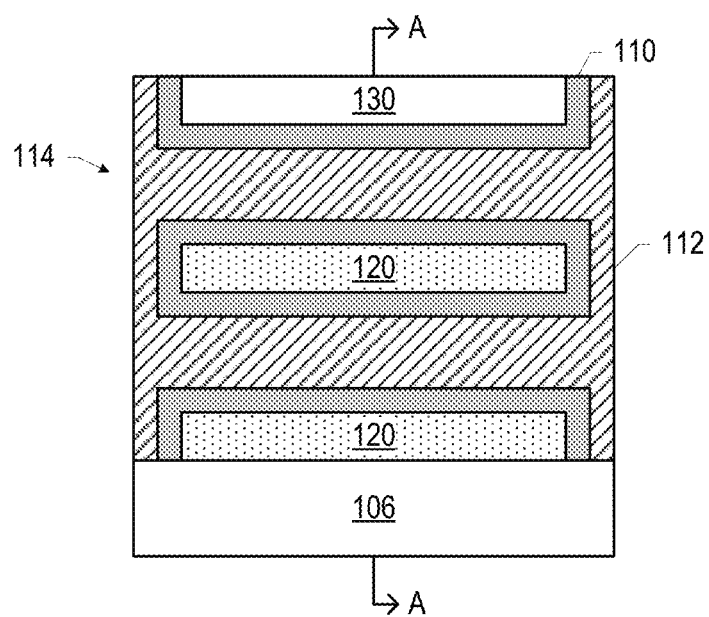
Figure 35A:
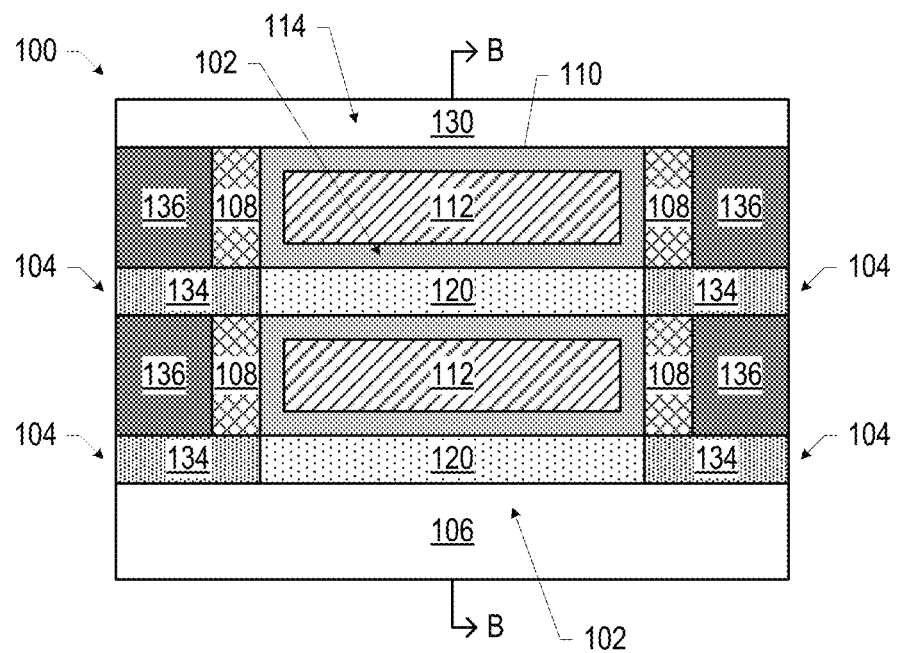
Figure 35B:
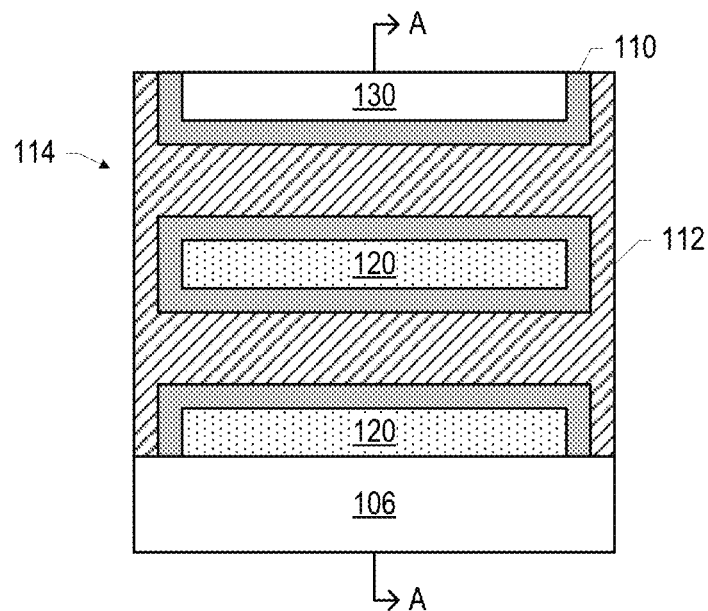

FIGS. 33-35 illustrate stages in an example process for manufacturing the 2DM transistor 100 of FIG. 32, in accordance with various embodiments. FIG. 33 illustrates an assembly including a material stack on a support 106. The material stack of FIG. 33 is similar to that of FIG. 24, but includes layers having both the 2DM 120 (for the 2DM channels 102) and the 2DM 134 (for the 2DM S/Ds 104) alternating with layers of the dielectric material 108. The material stack of FIG. 33 may be manufactured by forming the 2DM 120 and the 2DM 134 in accordance with the techniques discussed above with reference to FIGS. 17-18, then forming a layer of the dielectric material 108, and repeating this process as many times as desired.

FIG. 34 illustrates an assembly subsequent to etching the material stack of the assembly of FIG. 33 to form a projection on the support 106, removing some of the dielectric material 108, and forming the gate 114 by conformally depositing the gate dielectric on the assembly of FIG. 26 and subsequently depositing the gate metal 112. These operations may take any suitable form (e.g., in accordance with any of the embodiments discussed above with reference to FIGS. 25-27).

FIG. 35 illustrates an assembly subsequent to recessing the dielectric material 108 of the assembly of FIG. 34 and filling in the conductive material 136. The assembly of FIG. 35 may take the form of the 2DM transistor 100 of FIG. 32.

Figure 36A:
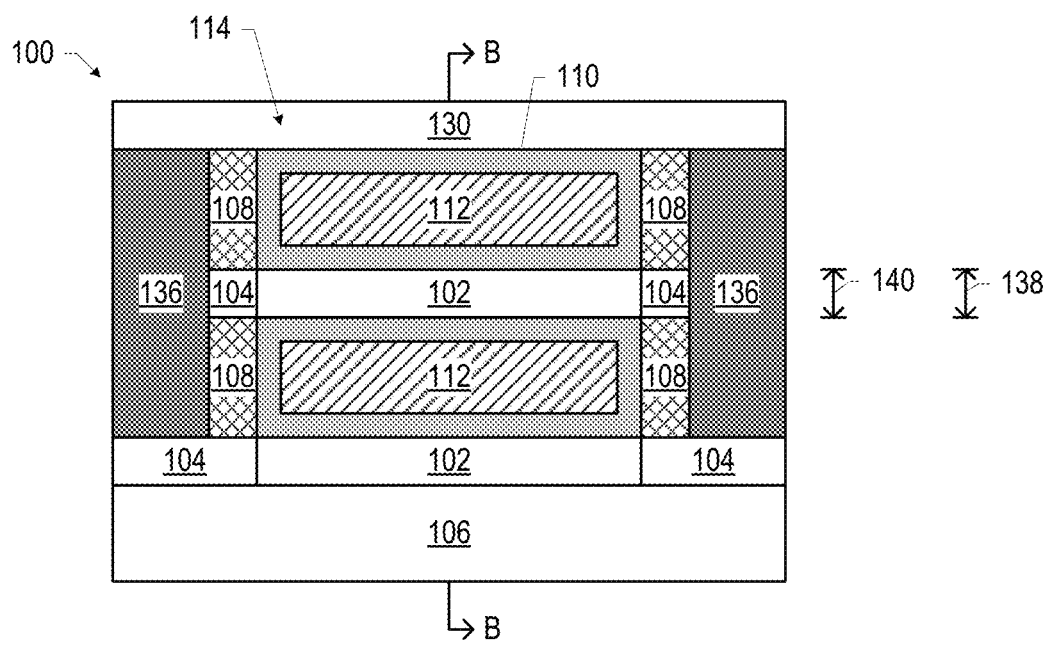
FIGS. 36A-36B are side, cross-sectional views of another 2DM transistor, in accordance with various embodiments.
Figure 36B:
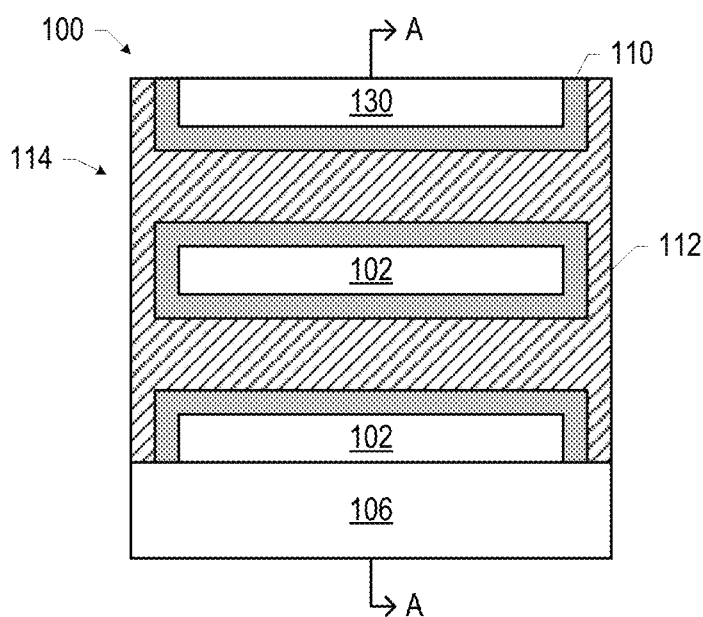

FIG. 36 illustrates another 2DM transistor 100. The particular embodiment of FIG. 36 shares a number of features with the embodiment of FIG. 31 (e.g., the thickness 138 of the 2DM channel 102 is the same as the thickness 140 of the 2DM S/Ds 104, and the 2DM channel 102 is coplanar with the 2DM S/Ds 104), but differs from the embodiment of FIG. 31 in that the 2DM S/Ds 104 are laterally coextensive with the spacers 108, and the conductive material 136 is partially coplanar with the gate 114 and partially coplanar with the 2DM S/Ds 104 and the 2DM channel 102 (e.g., as discussed above with reference to FIG. 21B). A 2DM transistor 100 like that of FIG. 36 may be manufactured using any suitable technique (e.g., any suitable ones of the techniques disclosed herein, with appropriate modifications).

Figure 37:
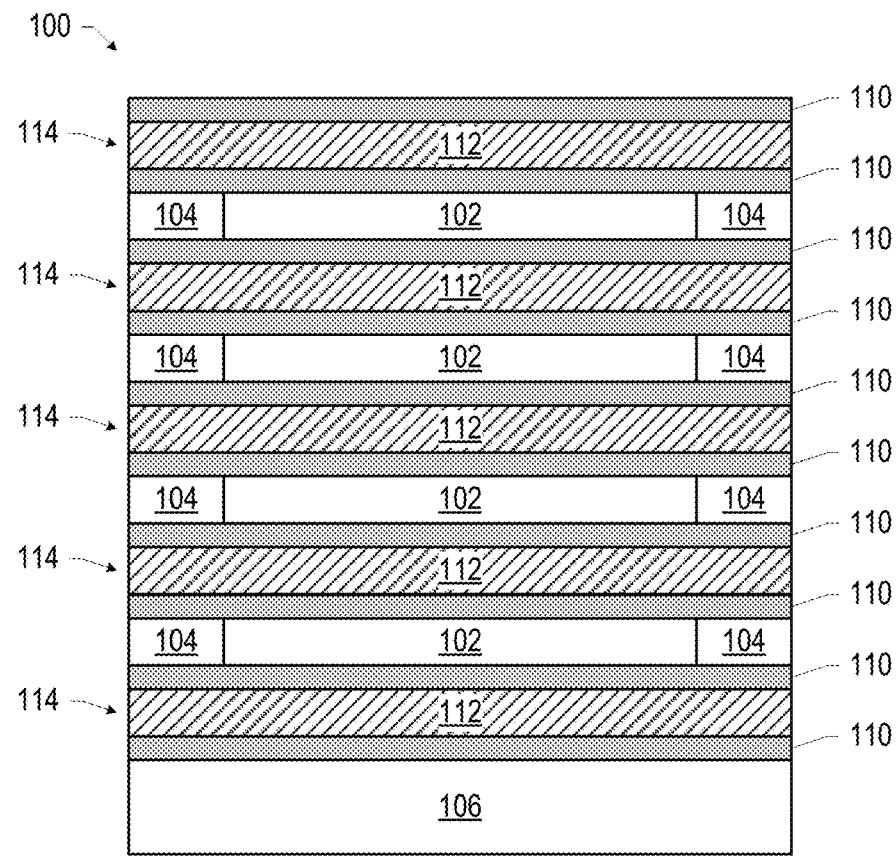
FIG. 37 is a side, cross-sectional view of another 2DM transistor, in accordance with various embodiments.

A multi-channel 2DM transistor 100 may have a structure different than those illustrated in FIGS. 22-23 and 30-32. For example, FIG. 37 is a side, cross-sectional view of another multi-channel 2DM transistor 100, in accordance with various embodiments. The 2DM transistor 100 of FIG. 37 includes alternating gates 114 and 2DM channel 102/2DM S/D 104 regions. A gate 114 may include a gate metal 112 spaced apart from an adjacent 2DM channel 102 and adjacent 2DM S/Ds 104 by a layer of gate dielectric 110; the number of gates 114 and 2DM channel 102/2DM S/D 104 regions in the stack may take any suitable form, and the 2DM channels 102 and 2DM S/Ds 104 in the stack may take any of the forms disclosed herein.

Figure 38:
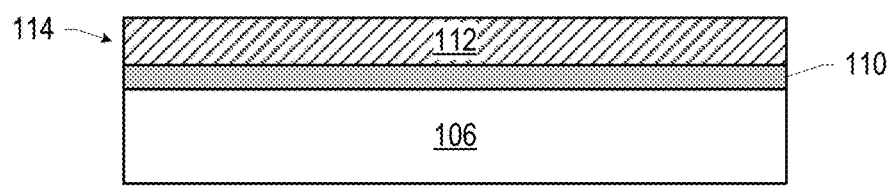
FIGS. 38-39 illustrate stages in an example process for manufacturing the 2DM transistor of FIG. 34, in accordance with various embodiments.
Figure 39:
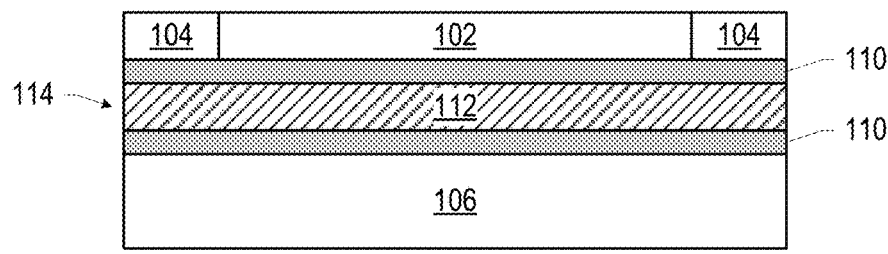

FIGS. 38-39 illustrate stages in an example process for manufacturing the 2DM transistor 100 of FIG. 34, in accordance with various embodiments. FIG. 38 illustrates an assembly subsequent to depositing a layer of gate dielectric 110 and a layer of gate metal 112 to form the 1st gate 114 on the support 106 of FIG. 3. In some embodiments, the layer of gate metal 112 may be formed directly on the support 106 without an intervening layer of gate dielectric 110.

FIG. 39 illustrates an assembly subsequent to depositing another layer of gate dielectric 110 on the gate metal 112 of the assembly of FIG. 38, and then forming a 2DM channel 102 and 2DM S/Ds 104 on the gate dielectric 110. The 2DM channel 102 and the 2DM S/Ds 104 of FIG. 39 may take any of the forms disclosed herein (e.g., may be formed in conjunction as discussed above with reference to FIGS. 10-11, may be separately formed as discussed above with reference to FIGS. 15-16, or may be grown by initial seed deposition as discussed above with reference to FIGS. 17-18). The operations discussed above with reference to FIG. 38 and the operations discussed with reference to FIG. 39 may then be repeated as many times as desired to form the 2DM transistor 100 of FIG. 34.

The 2DM transistors 100 disclosed herein may be included in any suitable electronic component. FIGS. 40-44 illustrate various examples of apparatuses that may include any of the 2DM transistors 100 disclosed herein.

Figure 40:
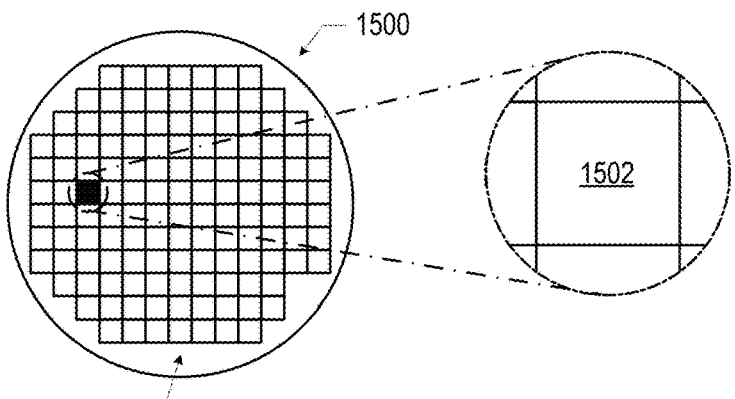
FIG. 40 is a top view of a wafer and dies that may include a 2DM transistor in accordance with any of the embodiments disclosed herein.

FIG. 40 is a top view of a wafer 1500 and dies 1502 that may include one or more 2DM transistors 100 in accordance with any of the embodiments disclosed herein. The wafer 1500 may be composed of semiconductor material and may include one or more dies 1502 having integrated circuit (IC) structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more 2DM transistors 100 (e.g., as discussed below with reference to FIG. 41), one or more transistors (e.g., some of the transistors 1640 of FIG. 41, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 44) or other logic that is configured to store information in the memory devices or execute instructions stored in the memory array.

Figure 41:
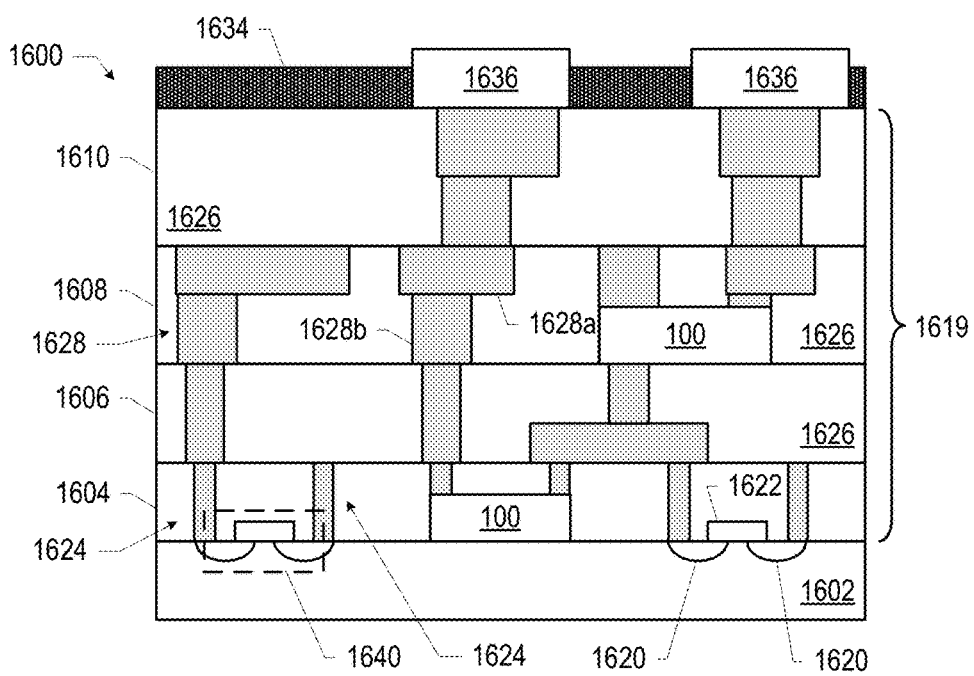
FIG. 41 is a side, cross-sectional view of an integrated circuit (IC) device that may include a 2DM transistor in accordance with any of the embodiments disclosed herein.

FIG. 41 is a side, cross-sectional view of an IC device 1600 that may include one or more 2DM transistors 100 in accordance with any of the embodiments disclosed herein. One or more of the IC devices 1600 may be included in one or more dies 1502 (FIG. 40). The IC device 1600 may be formed on a substrate 1602 (e.g., the wafer 1500 of FIG. 40) and may be included in a die (e.g., the die 1502 of FIG. 40). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 40) or a wafer (e.g., the wafer 1500 of FIG. 40).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 41 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, gold, silver, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

In some embodiments, the device layer 1604 may include one or more 2DM transistors 100, in addition to or instead of transistors 1640. FIG. 41 illustrates a single 2DM transistor 100 in the device layer 1604 for illustration purposes, but any number and structure of 2DM transistors 100 may be included in a device layer 1604. A 2DM transistor 100 included in a device layer 1604 may be referred to as a "front-end" device. In some embodiments, the IC device 1600 may not include any front-end 2DM transistors 100. One or more 2DM transistors 100 in the device layer 1604 may be coupled to any suitable other ones of the devices in the device layer 1604, to any devices in the metallization stack 1619 (discussed below), and/or to one or more of the conductive contacts 1636 (discussed below).

Electrical signals, such as power and/or input/output (I/O) signals, may be routed to and/or from the devices (e.g., the transistors 1640 and/or 2DM transistors 100) of the device layer 1604 through one or more interconnect layers disposed on the device layer 1604 (illustrated in FIG. 41 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600. In some embodiments, one or more 2DM transistors 100 may be disposed in one or more of the interconnect layers 1606-1610, in accordance with any of the techniques disclosed herein. FIG. 41 illustrates a single 2DM transistor 100 in the interconnect layer 1608 for illustration purposes, but any number and structure of 2DM transistors 100 may be included in any one or more of the layers in a metallization stack 1619. A 2DM transistor 100 included in the metallization stack 1619 may be referred to as a "back-end" device. In some embodiments, the IC device 1600 may not include any back-end 2DM transistors 100; in some embodiments, the IC device 1600 may include both front- and back-end 2DM transistors 100. One or more 2DM transistors 100 in the metallization stack 1619 may be coupled to any suitable ones of the devices in the device layer 1604, and/or to one or more of the conductive contacts 1636 (discussed below).

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 41). Although a particular number of interconnect layers 1606-1610 is depicted in FIG. 41, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 41. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 41. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 41, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 42:
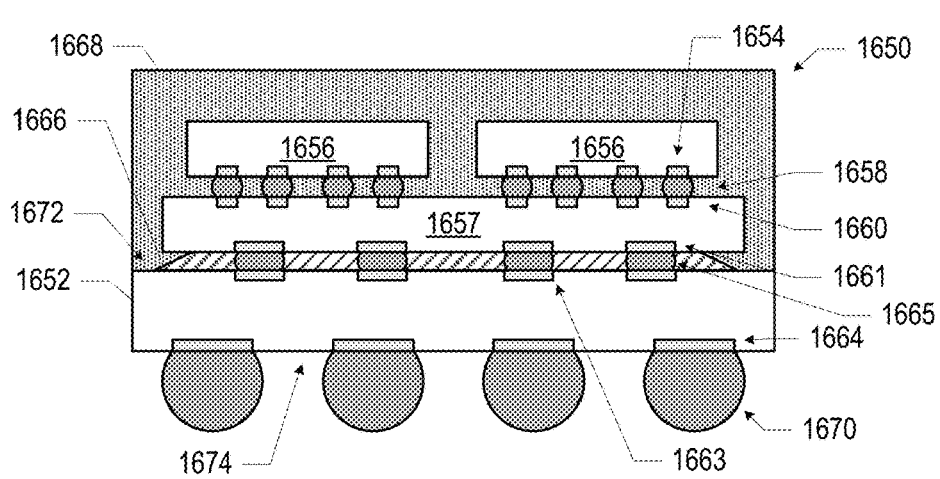
FIG. 42 is a side, cross-sectional view of an IC package that may include a 2DM transistor in accordance with any of the embodiments disclosed herein.

FIG. 42 is a side, cross-sectional view of an example IC package 1650 that may include one or more 2DM transistors 100. In some embodiments, the IC package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may take the form of any of the interconnect structures 1628 discussed above with reference to FIG. 41.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 (or to other devices included in the package substrate 1652, not shown).

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 42 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., (e.g., a silicon bridge, an organic bridge, one or more waveguides, one or more interposers, wirebonds, etc.).

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 42 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 42 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 43.

The dies 1656 may take the form of any of the embodiments of the die 1502 discussed herein (e.g., may include any of the embodiments of the IC device 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory). In some embodiments, a die 1656 may include one or more 2DM transistors 100 (e.g., as discussed above with reference to FIG. 40 and FIG. 41)

Although the IC package 1650 illustrated in FIG. 42 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 42, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 43:
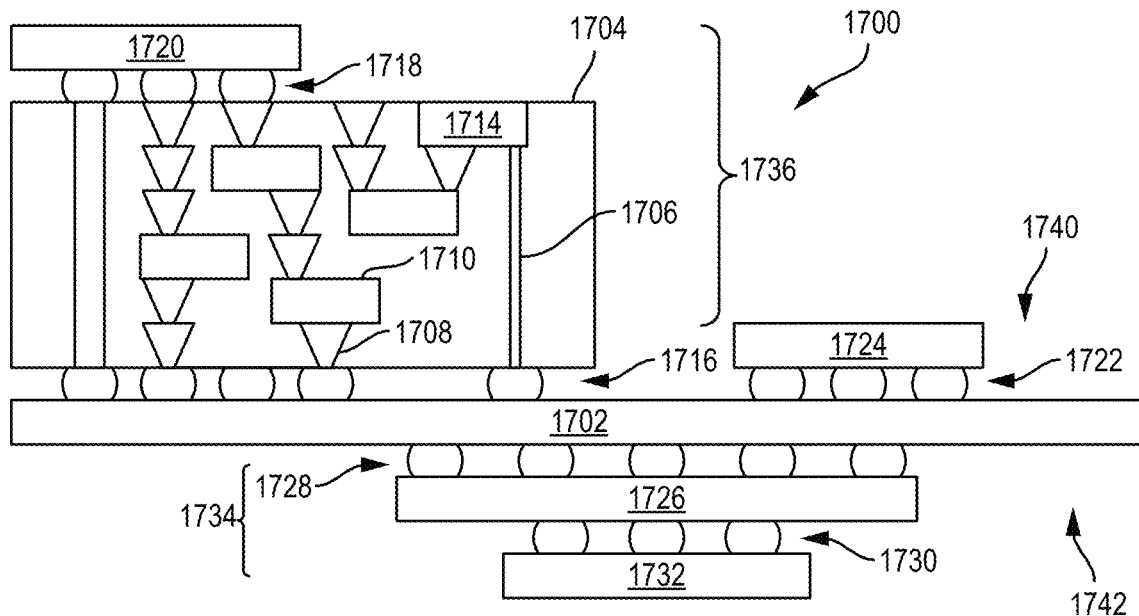
FIG. 43 is a side, cross-sectional view of an IC device assembly that may include a 2DM transistor in accordance with any of the embodiments disclosed herein.

FIG. 43 is a side, cross-sectional view of an IC device assembly 1700 that may include one or more IC packages or other electronic components (e.g., a die) including one or more 2DM transistors 100 in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 42 (e.g., may include one or more 2DM transistors 100 in a die).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 43 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 43), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 43, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 40), an IC device (e.g., the IC device 1600 of FIG. 41), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 43, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group Ill-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 43 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 44:
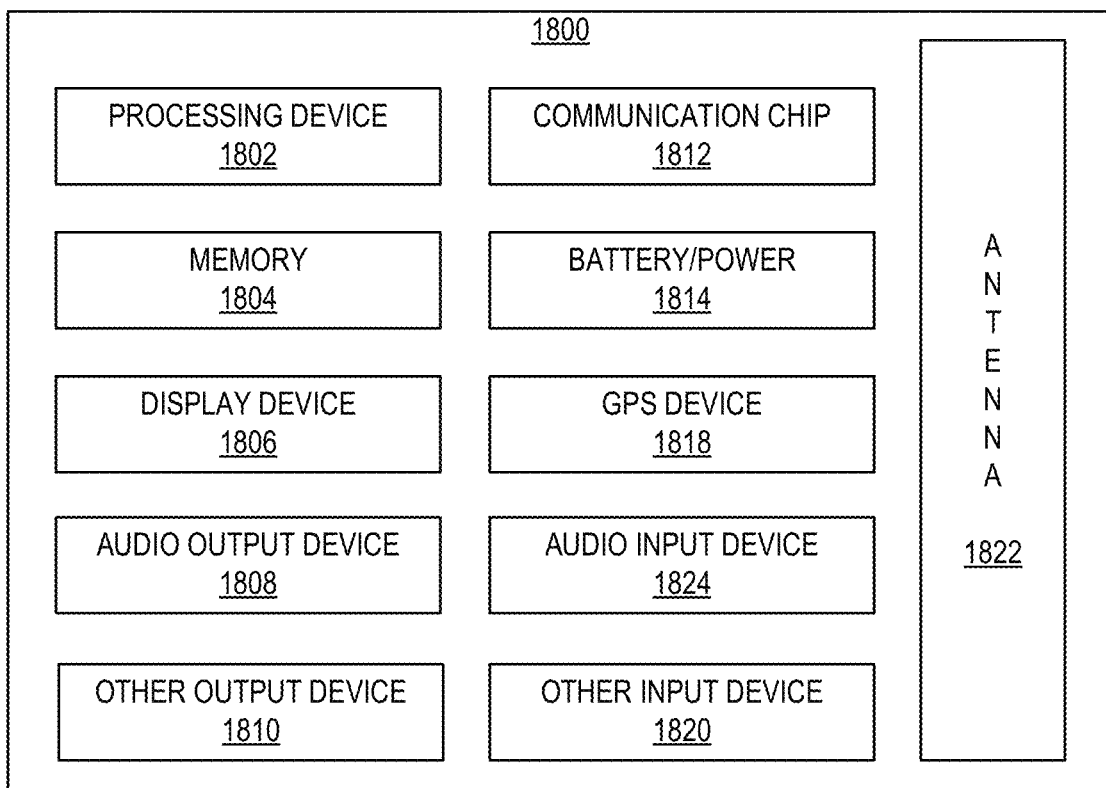
FIG. 44 is a block diagram of an example electrical device that may include a 2DM transistor in accordance with any of the embodiments disclosed herein.

FIG. 44 is a block diagram of an example electrical device 1800 that may include one or more 2DM transistors 100 in accordance with any of the embodiments disclosed herein. For example, any suitable ones of the components of the electrical device 1800 may include one or more of the IC device assemblies 1700, IC packages 1650, IC devices 1600, or dies 1502 disclosed herein. A number of components are illustrated in FIG. 44 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 44, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example A1 is a microelectronic structure, including a transistor, wherein the transistor includes: a channel, wherein the channel includes a first two-dimensional material region, and a source/drain (S/D), wherein the S/D includes a second two-dimensional material region, and a thickness of the first two-dimensional material region is less than a thickness of the second two-dimensional material region.

Example A2 includes the subject matter of Example A1, and further specifies that the first two-dimensional material region includes three or fewer layers of a two-dimensional material.

Example A3 includes the subject matter of any of Examples A1-2, and further specifies that the first two-dimensional material region includes a single layer of a two-dimensional material.

Example A4 includes the subject matter of any of Examples A1-3, and further specifies that the second two-dimensional material region includes more than three layers of a two-dimensional material.

Example A5 includes the subject matter of any of Examples A1-4, and further specifies that the second two-dimensional material region includes ten or fewer layers of a two-dimensional material.

Example A6 includes the subject matter of any of Examples A1-5, and further specifies that the first two-dimensional material region includes a metal chalcogenide.

Example A7 includes the subject matter of any of Examples A1-6, and further specifies that the first two-dimensional material region includes molybdenum, tungsten, niobium, tantalum, zirconium, hafnium, gallium, indium, or tin.

Example A8 includes the subject matter of any of Examples A1-7, and further specifies that the first two-dimensional material region includes sulfur, selenium, or tellurium.

Example A9 includes the subject matter of any of Examples A1-8, and further specifies that the second two-dimensional material region includes a metal chalcogenide.

Example A10 includes the subject matter of any of Examples A1-9, and further specifies that the second two-dimensional material region includes molybdenum, tungsten, niobium, tantalum, zirconium, hafnium, gallium, indium, tin, vanadium, or rhenium.

Example A11 includes the subject matter of any of Examples A1-10, and further specifies that the second two-dimensional material region includes sulfur, selenium, or tellurium.

Example A12 includes the subject matter of any of Examples A1-11, and further specifies that the second two-dimensional material region is in contact with a metal, and the metal includes ruthenium, antimony, or bismuth.

Example A13 includes the subject matter of any of Examples A1-12, and further specifies that the first two-dimensional material region has a same material composition as the second two-dimensional material region.

Example A14 includes the subject matter of any of Examples A1-12, and further specifies that the first two-dimensional material region has a different material composition than the second two-dimensional material region.

Example A15 includes the subject matter of Example A14, and further specifies that the second two-dimensional material region includes vanadium, niobium, or tantalum.

Example A16 includes the subject matter of Example A14, and further specifies that the second two-dimensional material region includes rhenium or manganese.

Example A17 includes the subject matter of Example A14, and further specifies that the second two-dimensional material region includes phosphorous, arsenic, antimony, or bromine.

Example A18 includes the subject matter of any of Examples A14-17, and further specifies that the first two-dimensional material region includes a first metal chalcogenide (MC), the second two-dimensional material region includes a second MC, and the first MC includes a different transition metal than the second MC.

Example A19 includes the subject matter of any of Examples A14-18, and further specifies that the first two-dimensional material region includes a first metal chalcogenide (MC), the second two-dimensional material region includes a second MC, and the first MC includes a different chalcogen than the second MC.

Example A20 includes the subject matter of any of Examples A14-19, and further specifies that the first two-dimensional material region includes a semiconductor material, and the second two-dimensional material region includes a metallic material.

Example A21 includes the subject matter of any of Examples A14-20, and further specifies that the first two-dimensional material region includes a two-dimensional material, and the second two-dimensional material region includes the two-dimensional material and an additive.

Example A22 includes the subject matter of any of Examples A1-21, and further specifies that the S/D is a first S/D, the transistor includes a second S/D, and the channel is between the first S/D and the second S/D.

Example A23 includes the subject matter of any of Examples A1-22, and further specifies that the transistor includes a gate proximate to the channel.

Example A24 includes the subject matter of Example A23, and further specifies that the S/D is a first S/D, the transistor includes a second S/D, and the gate is at least partially between the first S/D and the second S/D.

Example A25 includes the subject matter of Example A24, and further specifies that the gate has a length that is less than 10 nanometers.

Example A26 includes the subject matter of any of Examples A24-25, and further includes: a support, wherein the channel is between the support and at least a portion of the gate.

Example A27 includes the subject matter of Example A26, and further specifies that the support includes silicon or hafnium.

Example A28 includes the subject matter of any of Examples A1-27, and further specifies that the channel is one of a plurality of parallel channels of the transistor.

Example A29 includes the subject matter of Example A28, and further specifies that the plurality of parallel channels includes a vertical arrangement of parallel channels.

Example A30 includes the subject matter of any of Examples A28-29, and further specifies that the transistor includes a gate, and the gate wraps at least partially around the plurality of parallel channels.

Example A31 includes the subject matter of any of Examples A1-30, and further includes: a metallization stack, wherein the transistor is included in a device layer of the microelectronic structure, and the metallization stack is above the device layer.

Example A32 includes the subject matter of any of Examples A1-31, and further specifies that a grain size of the first two-dimensional material region is less than 5 microns.

Example A33 includes the subject matter of any of Examples A1-32, and further specifies that a grain size of the first two-dimensional material region is less than 1 micron.

Example A34 includes the subject matter of any of Examples A1-33, and further includes: a hardmask on the S/D.

Example A35 is a microelectronic structure, including a transistor, wherein the transistor includes: a channel, wherein the channel includes a first two-dimensional material, and a source/drain (S/D), wherein the S/D includes a second two-dimensional material, wherein the first two-dimensional material has a different material composition than the second two-dimensional material.

Example A36 includes the subject matter of Example A35, and further specifies that the channel includes a first number of layers of the first two-dimensional material, the S/D includes a second number of layers of the second two-dimensional material, and the first number of layers is less than the second number of layers.

Example A37 includes the subject matter of Example A36, and further specifies that the first number of layers is three or less.

Example A38 includes the subject matter of any of Examples A36-37, and further specifies that the first number of layers is one.

Example A39 includes the subject matter of any of Examples A36-38, and further specifies that the second number of layers is three or greater.

Example A40 includes the subject matter of any of Examples A36-39, and further specifies that the second number of layers is ten or less.

Example A41 includes the subject matter of any of Examples A35-40, and further specifies that the first two-dimensional material includes a metal chalcogenide (MC).

Example A42 includes the subject matter of any of Examples A35-41, and further specifies that the first two-dimensional material includes molybdenum, tungsten, niobium, tantalum, zirconium, hafnium, gallium, indium, or tin.

Example A43 includes the subject matter of any of Examples A35-42, and further specifies that the first two-dimensional material includes sulfur, selenium, or tellurium.

Example A44 includes the subject matter of any of Examples A35-43, and further specifies that the second two-dimensional material includes a metal chalcogenide (MC).

Example A45 includes the subject matter of any of Examples A35-44, and further specifies that the second two-dimensional material includes molybdenum, tungsten, niobium, tantalum, zirconium, hafnium, gallium, indium, tin, vanadium, or rhenium.

Example A46 includes the subject matter of any of Examples A35-45, and further specifies that the second two-dimensional material includes sulfur, selenium, or tellurium.

Example A47 includes the subject matter of any of Examples A35-46, and further specifies that the second two-dimensional material is in contact with a metal, and the metal includes ruthenium, antimony, or bismuth.

Example A48 includes the subject matter of any of Examples A35-47, and further specifies that the second two-dimensional material includes vanadium, niobium, or tantalum.

Example A49 includes the subject matter of any of Examples A35-48, and further specifies that the second two-dimensional material includes rhenium or manganese.

Example A50 includes the subject matter of any of Examples A35-49, and further specifies that the second two-dimensional material includes phosphorous, arsenic, antimony, or bromine.

Example A51 includes the subject matter of any of Examples A35-50, and further specifies that the first two-dimensional material includes a first metal chalcogenide (MC), the second two-dimensional material includes a second MC, and the first MC includes a different transition metal than the second MC.

Example A52 includes the subject matter of any of Examples A35-51, and further specifies that the first two-dimensional material includes a first metal chalcogenide (MC), the second two-dimensional material includes a second MC, and the first MC includes a different chalcogen than the second MC.

Example A53 includes the subject matter of any of Examples A35-52, and further specifies that the S/D is a first S/D, the transistor includes a second S/D, and the channel is between the first S/D and the second S/D.

Example A54 includes the subject matter of any of Examples A35-53, and further specifies that the transistor includes a gate proximate to the channel.

Example A55 includes the subject matter of Example A54, and further specifies that the S/D is a first S/D, the transistor includes a second S/D, and the gate is at least partially between the first S/D and the second S/D.

Example A56 includes the subject matter of any of Examples A54-55, and further specifies that the gate has a length that is less than 10 nanometers.

Example A57 includes the subject matter of any of Examples A35-56, and further includes: a support, wherein the channel is between the support and at least a portion of the gate.

Example A58 includes the subject matter of Example A57, and further specifies that the support includes silicon or hafnium.

Example A59 includes the subject matter of any of Examples A35-58, and further specifies that the channel is one of a plurality of parallel channels of the transistor.

Example A60 includes the subject matter of Example A59, and further specifies that the plurality of parallel channels includes a vertical arrangement of parallel channels.

Example A61 includes the subject matter of any of Examples A59-60, and further specifies that the transistor includes a gate, and the gate wraps at least partially around the plurality of parallel channels.

Example A62 includes the subject matter of any of Examples A35-61, and further includes: a metallization stack, wherein the transistor is included in a device layer of the microelectronic structure, and the metallization stack is above the device layer.

Example A63 includes the subject matter of any of Examples A35-62, and further specifies that the first two-dimensional material includes a semiconductor material, and the second two-dimensional material includes a metallic material.

Example A64 includes the subject matter of any of Examples A35-63, and further specifies that a grain size of the first two-dimensional material is less than 5 microns.

Example A65 includes the subject matter of any of Examples A35-64, and further specifies that a grain size of the first two-dimensional material is less than 1 micron.

Example A66 includes the subject matter of any of Examples A35-65, and further includes: a hardmask on the S/D.

Example A67 includes the subject matter of any of Examples A35-66, and further specifies that the first two-dimensional material includes a two-dimensional material, and the second two-dimensional material includes the two-dimensional material and an additive.

Example A68 is an electronic device, including: an integrated circuit (IC) die including a microelectronic structure, wherein the microelectronic structure includes a transistor, the transistor includes a first two-dimensional material in a channel, the transistor includes a second two-dimensional material in a source/drain (S/D), and the first two-dimensional material and the second two-dimensional material have different compositions or thicknesses; and a circuit board, wherein the IC die is coupled to the circuit board.

Example A69 includes the subject matter of Example A68, and further specifies that the channel includes a first number of layers of the first two-dimensional material, the S/D includes a second number of layers of the second two-dimensional material, and the first number of layers is less than the second number of layers.

Example A70 includes the subject matter of Example A69, and further specifies that the first number of layers is three or less.

Example A71 includes the subject matter of any of Examples A69-70, and further specifies that the first number of layers is one.

Example A72 includes the subject matter of any of Examples A69-71, and further specifies that the second number of layers is three or greater.

Example A73 includes the subject matter of any of Examples A69-72, and further specifies that the second number of layers is ten or less.

Example A74 includes the subject matter of any of Examples A68-73, and further specifies that the first two-dimensional material includes a metal chalcogenide (MC).

Example A75 includes the subject matter of any of Examples A68-74, and further specifies that the first two-dimensional material includes molybdenum, tungsten, niobium, tantalum, zirconium, hafnium, gallium, indium, or tin.

Example A76 includes the subject matter of any of Examples A68-75, and further specifies that the first two-dimensional material includes sulfur, selenium, or tellurium.

Example A77 includes the subject matter of any of Examples A68-76, and further specifies that the second two-dimensional material includes a metal chalcogenide (MC).

Example A78 includes the subject matter of any of Examples A68-77, and further specifies that the second two-dimensional material includes molybdenum, tungsten, niobium, tantalum, zirconium, hafnium, gallium, indium, tin, vanadium, or rhenium.

Example A79 includes the subject matter of any of Examples A68-78, and further specifies that the second two-dimensional material includes sulfur, selenium, or tellurium.

Example A80 includes the subject matter of any of Examples A68-79, and further specifies that the second two-dimensional material is in contact with a metal, and the metal includes ruthenium, antimony, or bismuth.

Example A81 includes the subject matter of any of Examples A68-80, and further specifies that the second two-dimensional material includes vanadium, niobium, or tantalum.

Example A82 includes the subject matter of any of Examples A68-81, and further specifies that the second two-dimensional material includes rhenium or manganese.

Example A83 includes the subject matter of any of Examples A68-82, and further specifies that the second two-dimensional material includes phosphorous, arsenic, antimony, or bromine.

Example A84 includes the subject matter of any of Examples A68-83, and further specifies that the first two-dimensional material includes a first metal chalcogenide (MC), the second two-dimensional material includes a second MC, and the first MC includes a different transition metal than the second MC.

Example A85 includes the subject matter of any of Examples A68-84, and further specifies that the first two-dimensional material includes a first metal chalcogenide (MC), the second two-dimensional material includes a second MC, and the first MC includes a different chalcogen than the second MC.

Example A86 includes the subject matter of any of Examples A68-85, and further specifies that the S/D is a first S/D, the transistor includes a second S/D, and the channel is between the first S/D and the second S/D.

Example A87 includes the subject matter of any of Examples A68-86, and further specifies that the transistor includes a gate proximate to the channel.

Example A88 includes the subject matter of Example A87, and further specifies that the S/D is a first S/D, the transistor includes a second S/D, and the gate is at least partially between the first S/D and the second S/D.

Example A89 includes the subject matter of any of Examples A87-88, and further specifies that the gate has a length that is less than 10 nanometers.

Example A90 includes the subject matter of any of Examples A68-89, and further includes: a support, wherein the channel is between the support and at least a portion of the gate.

Example A91 includes the subject matter of Example A90, and further specifies that the support includes silicon or hafnium.

Example A92 includes the subject matter of any of Examples A68-91, and further specifies that the channel is one of a plurality of parallel channels of the transistor.

Example A93 includes the subject matter of Example A92, and further specifies that the plurality of parallel channels includes a vertical arrangement of parallel channels.

Example A94 includes the subject matter of any of Examples A92-93, and further specifies that the transistor includes a gate, and the gate wraps at least partially around the plurality of parallel channels.

Example A95 includes the subject matter of any of Examples A68-94, and further includes: a metallization stack, wherein the transistor is included in a device layer of the microelectronic structure, and the metallization stack is above the device layer.

Example A96 includes the subject matter of any of Examples A68-95, and further specifies that the first two-dimensional material includes a semiconductor material, and the second two-dimensional material includes a metallic material.

Example A97 includes the subject matter of any of Examples A68-96, and further specifies that a grain size of the first two-dimensional material is less than 5 microns.

Example A98 includes the subject matter of any of Examples A68-97, and further specifies that a grain size of the first two-dimensional material is less than 1 micron.

Example A99 includes the subject matter of any of Examples A68-98, and further includes: a hardmask on the S/D.

Example A100 includes the subject matter of any of Examples A68-99, and further specifies that the first two-dimensional material includes a two-dimensional material, and the second two-dimensional material includes the two-dimensional material and an additive.

Example A101 includes the subject matter of any of Examples A68-100, and further specifies that the circuit board is a motherboard.

Example A102 includes the subject matter of any of Examples A68-101, and further specifies that the IC die is coupled to a package substrate.

Example A103 includes the subject matter of any of Examples A68-102, and further includes: an antenna communicatively coupled to the circuit board.

Example A104 includes the subject matter of any of Examples A68-103, and further includes: a display communicatively coupled to the circuit board.

Example A105 includes the subject matter of any of Examples A68-104, and further includes: a speaker communicatively coupled to the circuit board.

Example A106 includes the subject matter of any of Examples A68-105, and further specifies that the electronic device is a handheld device.

Example A107 includes the subject matter of any of Examples A68-105, and further specifies that the electronic device is a server device.

Example A108 includes the subject matter of any of Examples A68-105, and further specifies that the electronic device is a vehicular computing device.

Example B1 is a microelectronic structure, including a transistor, wherein the transistor includes: a channel, wherein the channel includes a first two-dimensional material region, and the first two-dimensional material region is a single-crystal two-dimensional material region, and a source/drain (S/D), wherein the S/D includes a second two-dimensional material region.

Example B2 includes the subject matter of Example B1, and further specifies that a thickness of the first two-dimensional material region is less than a thickness of the second two-dimensional material region.

Example B3 includes the subject matter of Example B2, and further specifies that the first two-dimensional material region includes three or fewer layers of a two-dimensional material.

Example B4 includes the subject matter of any of Examples B2-3, and further specifies that the first two-dimensional material region includes a single layer of a two-dimensional material.

Example B5 includes the subject matter of any of Examples B2-4, and further specifies that the second two-dimensional material region includes a number of layers of a two-dimensional material, and the number of layers is between 3 and Example B10.

Example B6 includes the subject matter of any of Examples B1-5, and further specifies that the first two-dimensional material region includes a metal chalcogenide (MC).

Example B7 includes the subject matter of any of Examples B1-6, and further specifies that the first two-dimensional material region includes molybdenum, tungsten, niobium, tantalum, zirconium, hafnium, gallium, indium, or tin.

Example B8 includes the subject matter of any of Examples B1-7, and further specifies that the first two-dimensional material region includes sulfur, selenium, or tellurium.

Example B9 includes the subject matter of any of Examples B1-8, and further specifies that the second two-dimensional material region includes a metal chalcogenide (MC).

Example B10 includes the subject matter of any of Examples B1-9, and further specifies that the second two-dimensional material region includes molybdenum, tungsten, niobium, tantalum, zirconium, hafnium, gallium, indium, tin, vanadium, or rhenium.

Example B11 includes the subject matter of any of Examples B1-10, and further specifies that the second two-dimensional material region includes sulfur, selenium, or tellurium.

Example B12 includes the subject matter of any of Examples B1-11, and further specifies that the second two-dimensional material region is in contact with a metal, and the metal includes ruthenium, antimony, or bismuth.

Example B13 includes the subject matter of any of Examples B1-12, and further specifies that the first two-dimensional material region has a same material composition as the second two-dimensional material region.

Example B14 includes the subject matter of any of Examples B1-12, and further specifies that the first two-dimensional material region has a different material composition than the second two-dimensional material region.

Example B15 includes the subject matter of Example B14, and further specifies that the second two-dimensional material region includes vanadium, niobium, or tantalum.

Example B16 includes the subject matter of Example B14, and further specifies that the second two-dimensional material region includes rhenium or manganese.

Example B17 includes the subject matter of Example B14, and further specifies that the second two-dimensional material region includes phosphorous, arsenic, antimony, or bromine.

Example B18 includes the subject matter of any of Examples B14-17, and further specifies that the first two-dimensional material region includes a first metal chalcogenide (MC), the second two-dimensional material region includes a second MC, and the first MC includes a different transition metal than the second MC.

Example B19 includes the subject matter of any of Examples B14-18, and further specifies that the first two-dimensional material region includes a first metal chalcogenide (MC), the second two-dimensional material region includes a second MC, and the first MC includes a different chalcogen than the second MC.

Example B20 includes the subject matter of any of Examples B14-19, and further specifies that the first two-dimensional material region includes a semiconductor material, and the second two-dimensional material region includes a metallic material.

Example B21 includes the subject matter of any of Examples B14-20, and further specifies that the first two-dimensional material region includes a two-dimensional material, and the second two-dimensional material region includes the two-dimensional material and an additive.

Example B22 includes the subject matter of any of Examples B1-21, and further specifies that the S/D is a first S/D, the transistor includes a second S/D, and the channel is between the first S/D and the second S/D.

Example B23 includes the subject matter of Example B22, and further specifies that the transistor includes a gate proximate to the channel.

Example B24 includes the subject matter of Example B23, and further specifies that the gate includes a first gate portion and a second gate portion, the channel is between the first S/D and the second S/D in a first direction, the channel is between the first gate portion and the second gate portion in a second direction perpendicular to the first direction, the first S/D is between the first gate portion and the second gate portion in the second direction, and the second S/D is between the first gate portion and the second gate portion in the second direction.

Example B25 includes the subject matter of Example B24, and further specifies that the gate has a length that is less than 10 nanometers.

Example B26 includes the subject matter of any of Examples B24-25, and further includes: a support, wherein the channel is between the support and at least a portion of the gate.

Example B27 includes the subject matter of Example B26, and further specifies that the support includes silicon or hafnium.

Example B28 includes the subject matter of any of Examples B1-27, and further specifies that the channel is one of a plurality of parallel channels of the transistor.

Example B29 includes the subject matter of Example B28, and further specifies that the plurality of parallel channels includes a vertical arrangement of parallel channels.

Example B30 includes the subject matter of any of Examples B28-29, and further specifies that the transistor includes a gate, and the gate wraps at least partially around the plurality of parallel channels.

Example B31 includes the subject matter of any of Examples B1-30, and further includes: a metallization stack, wherein the transistor is included in a device layer of the microelectronic structure, and the metallization stack is above the device layer.

Example B32 includes the subject matter of any of Examples B1-31, and further specifies that the channel includes seed residue.

Example B33 includes the subject matter of Example B32, and further specifies that the seed residue includes oxygen.

Example B34 includes the subject matter of any of Examples B1-33, and further specifies that the second two-dimensional material region is a single-crystal two-dimensional material region.

Example B35 is a microelectronic structure, including a transistor, wherein the transistor includes: a channel, wherein the channel includes a first two-dimensional material, and a source/drain (S/D), wherein the S/D includes a second two-dimensional material, and the second two-dimensional material is a single-crystal two-dimensional material.

Example B36 includes the subject matter of Example B35, and further specifies that the first two-dimensional material has a different material composition than the second two-dimensional material.

Example B37 includes the subject matter of any of Examples B35-36, and further specifies that the channel includes a first number of layers of the first two-dimensional material, the S/D includes a second number of layers of the second two-dimensional material, and the first number of layers is less than the second number of layers.

Example B38 includes the subject matter of Example B37, and further specifies that the first number of layers is three or less.

Example B39 includes the subject matter of any of Examples B37-38, and further specifies that the first number of layers is one.

Example B40 includes the subject matter of any of Examples B37-39, and further specifies that the second number of layers is between three and ten.

Example B41 includes the subject matter of any of Examples B35-40, and further specifies that the first two-dimensional material includes a metal chalcogenide (MC).

Example B42 includes the subject matter of any of Examples B35-41, and further specifies that the first two-dimensional material includes molybdenum, tungsten, niobium, tantalum, zirconium, hafnium, gallium, indium, or tin.

Example B43 includes the subject matter of any of Examples B35-42, and further specifies that the first two-dimensional material includes sulfur, selenium, or tellurium.

Example B44 includes the subject matter of any of Examples B35-43, and further specifies that the second two-dimensional material includes a metal chalcogenide (MC).

Example B45 includes the subject matter of any of Examples B35-44, and further specifies that the second two-dimensional material includes molybdenum, tungsten, niobium, tantalum, zirconium, hafnium, gallium, indium, tin, vanadium, or rhenium.

Example B46 includes the subject matter of any of Examples B35-45, and further specifies that the second two-dimensional material includes sulfur, selenium, or tellurium.

Example B47 includes the subject matter of any of Examples B35-46, and further specifies that the second two-dimensional material is in contact with a metal, and the metal includes ruthenium, antimony, or bismuth.

Example B48 includes the subject matter of any of Examples B35-47, and further specifies that the second two-dimensional material includes vanadium, niobium, or tantalum.

Example B49 includes the subject matter of any of Examples B35-48, and further specifies that the second two-dimensional material includes rhenium or manganese.

Example B50 includes the subject matter of any of Examples B35-49, and further specifies that the second two-dimensional material includes phosphorous, arsenic, antimony, or bromine.

Example B51 includes the subject matter of any of Examples B35-50, and further specifies that the first two-dimensional material includes a first metal chalcogenide (MC), the second two-dimensional material includes a second MC, and the first MC includes a different transition metal than the second MC.

Example B52 includes the subject matter of any of Examples B35-51, and further specifies that the first two-dimensional material includes a first metal chalcogenide (MC), the second two-dimensional material includes a second MC, and the first MC includes a different chalcogen than the second MC.

Example B53 includes the subject matter of any of Examples B35-52, and further specifies that the S/D is a first S/D, the transistor includes a second S/D, and the channel is between the first S/D and the second S/D.

Example B54 includes the subject matter of Example B53, and further specifies that the transistor includes a gate proximate to the channel.

Example B55 includes the subject matter of Example B54, and further specifies that the gate includes a first gate portion and a second gate portion, the channel is between the first S/D and the second S/D in a first direction, the channel is between the first gate portion and the second gate portion in a second direction perpendicular to the first direction, the first S/D is between the first gate portion and the second gate portion in the second direction, and the second S/D is between the first gate portion and the second gate portion in the second direction.

Example B56 includes the subject matter of any of Examples B54-55, and further specifies that the gate has a length that is less than 10 nanometers.

Example B57 includes the subject matter of any of Examples B35-56, and further includes: a support, wherein the channel is between the support and at least a portion of the gate.

Example B58 includes the subject matter of Example B57, and further specifies that the support includes silicon or hafnium.

Example B59 includes the subject matter of any of Examples B35-58, and further specifies that the channel is one of a plurality of parallel channels of the transistor.

Example B60 includes the subject matter of Example B59, and further specifies that the plurality of parallel channels includes a vertical arrangement of parallel channels.

Example B61 includes the subject matter of any of Examples B59-60, and further specifies that the transistor includes a gate, and the gate wraps at least partially around the plurality of parallel channels.

Example B62 includes the subject matter of any of Examples B35-61, and further includes: a metallization stack, wherein the transistor is included in a device layer of the microelectronic structure, and the metallization stack is above the device layer.

Example B63 includes the subject matter of any of Examples B35-62, and further specifies that the first two-dimensional material includes a semiconductor material, and the second two-dimensional material includes a metallic material.

Example B64 includes the subject matter of any of Examples B35-63, and further specifies that the S/D includes seed residue.

Example B65 includes the subject matter of Example B64, and further specifies that the seed residue includes oxygen.

Example B66 includes the subject matter of any of Examples B35-65, and further specifies that the channel includes seed residue.

Example B67 includes the subject matter of any of Examples B35-66, and further specifies that the first two-dimensional material includes a two-dimensional material, and the second two-dimensional material includes the two-dimensional material and an additive.

Example B68 is an electronic device, including: an integrated circuit (IC) die including a microelectronic structure, wherein the microelectronic structure includes a transistor, the transistor includes a first two-dimensional material in a channel, the transistor includes a second two-dimensional material in a source/drain (S/D), wherein the first two-dimensional material is a single-crystal material, and the second two-dimensional material is a single-crystal material; and a circuit board, wherein the IC die is coupled to the circuit board.

Example B69 includes the subject matter of Example B68, and further specifies that the channel includes a first number of layers of the first two-dimensional material, the S/D includes a second number of layers of the second two-dimensional material, and the first number of layers is less than the second number of layers.

Example B70 includes the subject matter of Example B69, and further specifies that the first number of layers is three or less.

Example B71 includes the subject matter of any of Examples B69-70, and further specifies that the first number of layers is one.

Example B72 includes the subject matter of any of Examples B69-71, and further specifies that the second number of layers is three or greater.

Example B73 includes the subject matter of any of Examples B69-72, and further specifies that the second number of layers is ten or less.

Example B74 includes the subject matter of any of Examples B68-73, and further specifies that the first two-dimensional material includes a metal chalcogenide (MC).

Example B75 includes the subject matter of any of Examples B68-74, and further specifies that the first two-dimensional material includes molybdenum, tungsten, niobium, tantalum, zirconium, hafnium, gallium, indium, or tin.

Example B76 includes the subject matter of any of Examples B68-75, and further specifies that the first two-dimensional material includes sulfur, selenium, or tellurium.

Example B77 includes the subject matter of any of Examples B68-76, and further specifies that the second two-dimensional material includes a metal chalcogenide (MC).

Example B78 includes the subject matter of any of Examples B68-77, and further specifies that the second two-dimensional material includes molybdenum, tungsten, niobium, tantalum, zirconium, hafnium, gallium, indium, tin, vanadium, or rhenium.

Example B79 includes the subject matter of any of Examples B68-78, and further specifies that the second two-dimensional material includes sulfur, selenium, or tellurium.

Example B80 includes the subject matter of any of Examples B68-79, and further specifies that the second two-dimensional material is in contact with a metal, and the metal includes ruthenium, antimony, or bismuth.

Example B81 includes the subject matter of any of Examples B68-80, and further specifies that the second two-dimensional material includes vanadium, niobium, or tantalum.

Example B82 includes the subject matter of any of Examples B68-81, and further specifies that the second two-dimensional material includes rhenium or manganese.

Example B83 includes the subject matter of any of Examples B68-82, and further specifies that the second two-dimensional material includes phosphorous, arsenic, antimony, or bromine.

Example B84 includes the subject matter of any of Examples B68-83, and further specifies that the first two-dimensional material includes a first metal chalcogenide (MC), the second two-dimensional material includes a second MC, and the first MC includes a different transition metal than the second MC.

Example B85 includes the subject matter of any of Examples B68-84, and further specifies that the first two-dimensional material includes a first metal chalcogenide (MC), the second two-dimensional material includes a second MC, and the first MC includes a different chalcogen than the second MC.

Example B86 includes the subject matter of any of Examples B68-85, and further specifies that the S/D is a first S/D, the transistor includes a second S/D, and the channel is between the first S/D and the second S/D.

Example B87 includes the subject matter of Example B86, and further specifies that the transistor includes a gate proximate to the channel.

Example B88 includes the subject matter of Example B87, and further specifies that the gate includes a first gate portion and a second gate portion, the channel is between the first S/D and the second S/D in a first direction, the channel is between the first gate portion and the second gate portion in a second direction perpendicular to the first direction, the first S/D is between the first gate portion and the second gate portion in the second direction, and the second S/D is between the first gate portion and the second gate portion in the second direction.

Example B89 includes the subject matter of any of Examples B87-88, and further specifies that the gate has a length that is less than 10 nanometers.

Example B90 includes the subject matter of any of Examples B68-89, and further includes: a support, wherein the channel is between the support and at least a portion of the gate.

Example B91 includes the subject matter of Example B90, and further specifies that the support includes silicon or hafnium.

Example B92 includes the subject matter of any of Examples B68-91, and further specifies that the channel is one of a plurality of parallel channels of the transistor.

Example B93 includes the subject matter of Example B92, and further specifies that the plurality of parallel channels includes a vertical arrangement of parallel channels.

Example B94 includes the subject matter of any of Examples B92-93, and further specifies that the transistor includes a gate, and the gate wraps at least partially around the plurality of parallel channels.

Example B95 includes the subject matter of any of Examples B68-94, and further includes: a metallization stack, wherein the transistor is included in a device layer of the microelectronic structure, and the metallization stack is above the device layer.

Example B96 includes the subject matter of any of Examples B68-95, and further specifies that the first two-dimensional material includes a semiconductor material, and the second two-dimensional material includes a metallic material.

Example B97 includes the subject matter of any of Examples B68-96, and further specifies that the channel includes seed residue.

Example B98 includes the subject matter of any of Examples B68-97, and further specifies that the S/D includes seed residue.

Example B99 includes the subject matter of any of Examples B68-98, and further specifies that the first two-dimensional material is adjacent to the second two-dimensional material.

Example B100 includes the subject matter of any of Examples B68-99, and further specifies that the first two-dimensional material includes a two-dimensional material, and the second two-dimensional material includes the two-dimensional material and an additive.

Example B101 includes the subject matter of any of Examples B68-100, and further specifies that the circuit board is a motherboard.

Example B102 includes the subject matter of any of Examples B68-101, and further specifies that the IC die is coupled to a package substrate.

Example B103 includes the subject matter of any of Examples B68-102, and further includes: an antenna communicatively coupled to the circuit board.

Example B104 includes the subject matter of any of Examples B68-103, and further includes: a display communicatively coupled to the circuit board.

Example B105 includes the subject matter of any of Examples B68-104, and further includes: a speaker communicatively coupled to the circuit board.

Example B106 includes the subject matter of any of Examples B68-105, and further specifies that the electronic device is a handheld device.

Example B107 includes the subject matter of any of Examples B68-105, and further specifies that the electronic device is a server device.

Example B108 includes the subject matter of any of Examples B68-105, and further specifies that the electronic device is a vehicular computing device.

The invention claimed is:

1. A microelectronic structure, comprising:
   a transistor, including:
      a channel, wherein the channel includes a first two-dimensional material region, and the first two-dimensional material region is a single crystal two-dimensional material region, and
      a region, wherein the region is either a source region or a drain region of the transistor, and the region includes a second two-dimensional material region.

2. The microelectronic structure of claim 1, wherein the second two-dimensional material region includes vanadium, niobium, or tantalum.

3. The microelectronic structure of claim 1, wherein the second two-dimensional material region includes phosphorous, arsenic, antimony, or bromine.

4. The microelectronic structure of claim 1, wherein the second two-dimensional material region is a single-crystal two-dimensional material region.

5. The microelectronic structure of claim 1, wherein the first two-dimensional material region or the second two-dimensional material region includes grains with grain size less than 5 microns.

6. The microelectronic structure of claim 1, wherein the first two-dimensional material region or the second two-dimensional material region has a variation in a material composition.

7. The microelectronic structure of claim 1, wherein the first two-dimensional material region or the second two-dimensional material region has a stepwise change in a material composition.

8. The microelectronic structure of claim 1, wherein the first two-dimensional material region or the second two-dimensional material region has a gradient change in a material composition.

9. The microelectronic structure of claim 1, wherein the second two-dimensional material region includes seed residue.

10. The microelectronic structure of claim 1, wherein the second two-dimensional material region is in contact with a metal, and the metal includes ruthenium, antimony, or bismuth.

11. The microelectronic structure of claim 1, wherein:
the region is a first region,
the transistor further includes a second region and a gate proximate to the channel,
the gate includes a first gate portion and a second gate portion,
the channel is between the first region and the second region in a first direction,
the channel is between the first gate portion and the second gate portion in a second direction perpendicular to the first direction,
the first region is between the first gate portion and the second gate portion in the second direction, and
the second region is between the first gate portion and the second gate portion in the second direction.

12. A microelectronic structure, comprising:
a transistor, including:
a channel, wherein the channel includes a first two-dimensional material, and
a region, wherein the region is one of a source region and a drain region of the transistor, the region includes a second two-dimensional material, and the second two-dimensional material is a single-crystal two-dimensional material.

13. The microelectronic structure of claim 12, wherein the first two-dimensional material includes a first metal chalcogenide (MC), the second two-dimensional material includes a second MC, and the first MC includes a different transition metal than the second MC.

14. The microelectronic structure of claim 12, wherein the first two-dimensional material includes a first metal chalcogenide (MC), the second two-dimensional material includes a second MC, and the first MC includes a different chalcogen than the second MC.

15. The microelectronic structure of claim 12, wherein the region includes seed residue.

16. The microelectronic structure of claim 12, wherein the channel includes seed residue.

17. The microelectronic structure of claim 12, wherein:
the region is a first region,
the transistor further includes a second region and a gate proximate to the channel,
the gate includes a first gate portion and a second gate portion,
the channel is between the first region and the second region in a first direction,
the channel is between the first gate portion and the second gate portion in a second direction perpendicular to the first direction,
the first region is between the first gate portion and the second gate portion in the second direction, and
the second region is between the first gate portion and the second gate portion in the second direction.

18. An electronic device, comprising:
an integrated circuit (IC) die including a microelectronic structure, wherein the microelectronic structure includes a transistor, the transistor includes a first two-dimensional material in a channel, the transistor includes a second two-dimensional material in a region that is one of a source region and a drain region of the transistor, wherein the first two-dimensional material is a single-crystal material, and the second two-dimensional material is a single-crystal material; and
a circuit board, wherein the IC die is coupled with the circuit board.

19. The electronic device of claim 18, wherein the region is a first region, the transistor includes a second region, the second region is another one of the source region and the drain region of the transistor, and the channel is between the first region and the second region in a first direction, the transistor includes a gate proximate to the channel, the gate includes a first gate portion and a second gate portion, the channel is between the first gate portion and the second gate portion in a second direction perpendicular to the first direction, the first region is between the first gate portion and the second gate portion in the second direction, and the second region is between the first gate portion and the second gate portion in the second direction.

20. The electronic device of claim 18, wherein the channel is one of a plurality of parallel channels of the transistor.

* * * * *